United States Patent
Nagami

(10) Patent No.: US 9,824,864 B2
(45) Date of Patent: Nov. 21, 2017

(54) PLASMA PROCESSING METHOD

(71) Applicant: Tokyo Electron Limited, Tokyo (JP)

(72) Inventor: Koichi Nagami, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/464,739

(22) Filed: Mar. 21, 2017

(65) Prior Publication Data

US 2017/0278677 A1 Sep. 28, 2017

(30) Foreign Application Priority Data

Mar. 22, 2016 (JP) .................... 2016-056943

(51) Int. Cl.
*H01J 7/24* (2006.01)
*H01J 37/32* (2006.01)

(52) U.S. Cl.
CPC .... *H01J 37/32174* (2013.01); *H01J 37/3244* (2013.01); *H01J 37/32091* (2013.01); *H01J 37/32183* (2013.01); *H01J 37/32577* (2013.01); *H01J 37/32697* (2013.01)

(58) Field of Classification Search
CPC .......... H01J 37/32082; H01J 37/32091; H01J 37/32165; H01J 37/32174; H01J 37/32183
USPC .................................................. 315/111.21
See application file for complete search history.

(56) References Cited

U.S. PATENT DOCUMENTS

| | | | | |
|---|---|---|---|---|
| 5,689,215 A * | 11/1997 | Richardson | ....... | H01J 37/32082 333/17.3 |
| 5,793,162 A * | 8/1998 | Barnes | ............. | H01J 37/32082 315/111.21 |
| 8,018,164 B2 * | 9/2011 | Shannon | ........... | H01J 37/32082 156/345.2 |
| 9,640,368 B2 * | 5/2017 | Umehara | .......... | H01J 37/32577 |
| 2005/0093459 A1 * | 5/2005 | Kishinevsky | ..... | H01J 37/32082 315/111.21 |
| 2013/0214683 A1 * | 8/2013 | Valcore, Jr. | ....... | H01J 37/32082 315/111.21 |

FOREIGN PATENT DOCUMENTS

JP 2013-058749 A 3/2013

* cited by examiner

*Primary Examiner* — Tung X Le

(74) *Attorney, Agent, or Firm* — Pearne & Gordon LLP

(57) ABSTRACT

In a plasma processing of generating plasma of different processing gases within a processing vessel in sequence, a setting of a high frequency power can be changed at an appropriate time point after the processing gas output from a gas supply system is changed. A power level of a second high frequency power is increased at a time point when a first parameter which reflects impedance of plasma exceeds a first threshold value after the processing gas is changed while a first high frequency power is being supplied to a first electrode or a second electrode. Further, a power level of the first high frequency power is increased at a time point when a second parameter which reflects impedance of plasma exceeds a second threshold value after the processing gas is changed while the second high frequency power is being supplied to the second electrode.

6 Claims, 14 Drawing Sheets

PLASMA PROCESSING METHOD

CROSS-REFERENCE TO RELATED APPLICATION

This application claims the benefit of Japanese Patent Application No. 2016-056943 filed on Mar. 22, 2016, the entire disclosures of which are incorporated herein by reference.

TECHNICAL FIELD

The embodiments described herein pertain generally to a plasma processing method performed by a plasma processing apparatus in processing a processing target object.

BACKGROUND

In the manufacture of an electronic device such as a semiconductor device, a plasma processing is performed on a processing target object by using a plasma processing apparatus. In general, the plasma processing apparatus includes a processing vessel, a gas supply system, a first electrode, a second electrode, a first high frequency power supply and a second high frequency power supply. The gas supply system is configured to supply a processing gas into the processing vessel. The first electrode and the second electrode are disposed with a space within the processing vessel therebetween. The first high frequency power supply is configured to generate a first high frequency power and supply the first high frequency power to either one electrode of the first electrode and the second electrode. The second high frequency power supply is configured to generate a second high frequency power having a relatively low frequency and supply the second high frequency power to the second electrode. Generally, in the plasma processing performed in this plasma processing apparatus, the processing gas is supplied into the processing vessel from the gas supply system, and the first high frequency power from the first high frequency power supply is supplied to the either one electrode. Accordingly, plasma of the processing gas is generated within the processing vessel. Further, the second high frequency power from the second high frequency power supply may be supplied to the second electrode when necessary.

As disclosed in Patent Document 1, for example, there is a plasma processing in which two separate stages of generating plasma of different processing gases are performed alternately. In this kind of plasma processing, when transitioning from a preceding stage to a succeeding stage, the processing gas supplied from the gas supply system is changed. Further, the second high frequency power is supplied to the second electrode only at the succeeding stage.

Since a gas has a mass, there is required a time period from a time point when the processing gas supplied from the gas supply system is changed to a time point when the processing gas within the processing vessel is actually changed. Meanwhile, the second high frequency power is supplied to the second electrode without any substantial delay. Accordingly, it happens that the second high frequency power is supplied to the second electrode before the processing gas within the processing vessel is changed. To solve this problem, in the plasma processing described in Patent Document 1, the supply of the second high frequency power is not begun until it is confirmed from a detection result of an emission spectrum within the processing vessel that the processing gas for the succeeding process has reached the processing vessel.

Patent Document 1: Japanese Patent Laid-open Publication No. 2013-058749

However, there may be no detectable difference between an emission spectrum of plasma of a processing gas used in a preceding stage and an emission spectrum of plasma of a processing gas used in a succeeding stage. In such a case, it may be difficult to accurately detect a time point when the processing gas is changed within the processing vessel. As a result, the second high frequency power may not be supplied to the second electrode at an appropriate timing.

Thus, in a plasma processing of generating plasma of different processing gases within the processing vessel in sequence, it is required to change a setting of a high frequency power at an appropriate time point after the processing gas supplied by the gas supply system is changed.

SUMMARY

In one exemplary embodiment, there is provided a plasma processing method performed by a plasma processing apparatus. The plasma processing apparatus includes a processing vessel, a gas supply system, a first electrode and a second electrode, a first high frequency power supply, a second high frequency power supply, a first power feed line, a second power feed line, a first matching device, a second matching device, a first operation unit and a second operation unit. The gas supply system is configured to supply a gas into the processing vessel. The first electrode and the second electrode are arranged with a space within the processing vessel therebetween. The first high frequency power supply is configured to output a first high frequency power. The second high frequency power supply is configured to output a second high frequency power having a frequency lower than that of the first high frequency power. The first power feed line is configured to connect the first high frequency power supply to either one electrode of the first electrode and the second electrode. The second power feed line is configured to connect the second high frequency power supply to the second electrode. The first matching device is configured to adjust a load impedance of the first high frequency power supply. The second matching device is configured to adjust a load impedance of the second high frequency power supply. The first operation unit is configured to calculate a first parameter including any one of the load impedance, a load resistance, a load reactance of the first high frequency power supply, and a reflection wave coefficient of the first high frequency power. The second operation unit is configured to calculate a second parameter including any one of the load impedance, a load resistance, a load reactance of the second high frequency power supply, and a reflection wave coefficient of the second high frequency power.

In the plasma processing method, multiple cycles, each having plural stages which generate plasma of different processing gases within the processing vessel and which are performed in sequence, are performed sequentially. The plasma processing method includes (i) changing the processing gas output from the gas supply system when transitioning from a first preceding stage to a first succeeding stage among the plural stages, the first high frequency power being supplied to the either one electrode in the first preceding stage; (ii) increasing a power level of the second high frequency power at a first time point when the first parameter exceeds a first threshold value after the processing gas output from the gas supply system is changed when transitioning from the first preceding stage to the first succeeding stage, the first high frequency power being continuously supplied to the either one electrode at least up to the first time point from the first preceding stage; (iii) changing the processing gas output from the gas supply system when transitioning from a second preceding stage to a second succeeding stage among the plural stages, the second high frequency power being supplied to the second electrode in the second preceding stage; and (iv) increasing a power level of the first high frequency power at a second time point when the second parameter exceeds a second threshold value after the processing gas output from the gas supply system is changed when transitioning from the second preceding stage to the second succeeding stage, the second high frequency power being continuously supplied to the second electrode at least up to the second time point from the second preceding stage.

If the processing gas within the processing vessel is changed while the supply of the first high frequency power is continued, the impedance of plasma generated within the processing vessel is changed. Since the aforementioned first parameter varies depending on the impedance of the plasma, the first parameter well reflects the variation in the processing gas which exists within the processing vessel. In the method according to the exemplary embodiment, by detecting the time point when this first parameter exceeds the first threshold value, the first time point when the processing gas within the processing vessel is changed can be detected accurately. Furthermore, since the power level of the second high frequency power is increased at this first time point, it is possible to increase the power level of the second high frequency power at an appropriate time point when the processing gas within the processing vessel is changed. Moreover, the second high frequency power may not be supplied to the second electrode in the first preceding stage and may be supplied to the second electrode at the first time point.

If the processing gas within the processing vessel is changed while the supply of the second high frequency power is continued, the impedance of plasma generated within the processing vessel is changed. Since the aforementioned second parameter varies depending on the impedance of the plasma, the second parameter well reflects the variation in the processing gas which exists within the processing vessel. In the method according to the exemplary embodiment, by detecting the time point when this second parameter exceeds the second threshold value, the second time point when the processing gas within the processing vessel is changed can be detected accurately. Furthermore, since the power level of the first high frequency power is increased at this second time point, it is possible to increase the power level of the first high frequency power at an appropriate time point when the processing gas within the processing vessel is changed. Moreover, the first high frequency power may not be supplied to the either one electrode in the second preceding stage and may be supplied to the either one electrode at the second time point.

The plasma processing method may further include (v) calculating, by a time adjusting unit of the plasma processing apparatus, a first time difference from when transitioning to the first succeeding stage to the first time point; (vi) adjusting a length of a preset processing time of the same stage as the first succeeding stage in a cycle performed after a preceding cycle among the multiple cycles to be increased by the first time difference obtained in the preceding cycle among the multiple cycles; (vii) calculating, by the time adjusting unit, a second time difference from when transitioning to the second succeeding stage to the second time point; and (viii) adjusting a length of a preset processing time of the same stage as the second succeeding stage in a cycle performed after a preceding cycle among the multiple cycles to be increased by the second time difference obtained in the preceding cycle among the multiple cycles. Further, the length of the processing time of each of the plural stages is initially set. Accordingly, if the time point when the first parameter exceeds the first threshold value at the first succeeding stage is delayed, the time length of the plasma processing from the first time point within the first succeeding stage is shortened. According to this exemplary embodiment, since the time length of the same stage as the first succeeding stage in a subsequent cycle is increased by the first time difference, the length of the total processing time of the plasma processing at the same stages in the multiple cycles can be maintained substantially same. This is the same for the same stage as the second succeeding stage in the multiple cycles.

The first preceding stage may be a first stage of generating plasma of a first processing gas while the first high frequency power is being supplied to the either one electrode. The first succeeding stage and the second preceding stage may be a second stage which follows the first stage and generates plasma of a second processing gas while the second high frequency power is being supplied to the second electrode. The second succeeding stage may be a third stage which follows the second stage and generates plasma of a third processing gas while the first high frequency power is being supplied to the either one electrode.

The first processing gas may contain a rare gas and a fluorocarbon gas, the second processing gas may contain a rare gas, and the third processing gas may contain a rare gas and an oxygen gas.

The plasma of the first processing gas may be generated in the first stage while the second high frequency power is not supplied to the second electrode. The plasma of the second processing gas may be generated in the second stage while the first high frequency power is not supplied to the either one electrode. The plasma of the third processing gas may be generated in the third stage while the second high frequency power is not supplied to the second electrode.

The plasma processing apparatus may further include a DC power supply connected to the first electrode and configured to generate a negative DC voltage. The plasma processing method may further include changing a level of the DC voltage at the first time point and/or the second time point. Changing the level of the DC voltage may be changing a state from the state that the DC voltage is not applied to the first electrode to the state that the DC voltage is applied to the first electrode or changing a state from the state that the DC voltage is applied to the first electrode to the state that the DC voltage is not applied to the first electrode.

According to the exemplary embodiment as stated above, in the plasma processing of generating plasma of different processing gases within the processing vessel in sequence, it is possible to change the setting of the high frequency power at the appropriate time point after the processing gas output from the gas supply system is changed.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
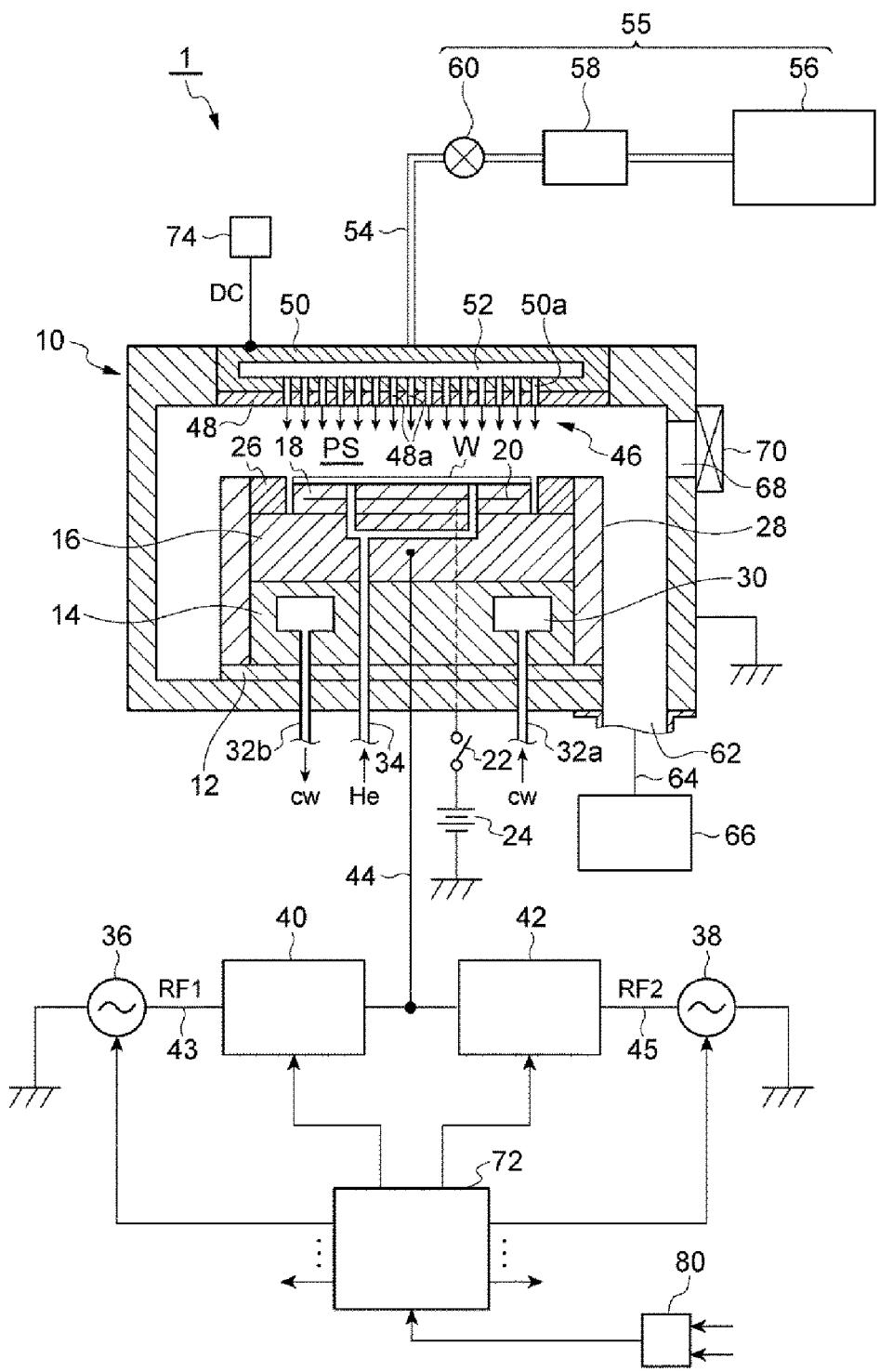
FIG. 1 is a diagram schematically illustrating a configuration of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a plasma processing apparatus capable of performing a plasma processing method according to an exemplary embodiment will be described. FIG. 1 is a diagram schematically illustrating a configuration of a plasma processing apparatus according to an exemplary embodiment. The plasma processing apparatus 1 shown in FIG. 1 is configured as a capacitively coupled plasma processing apparatus. The plasma processing apparatus 1 includes a processing vessel 10. The processing vessel 10 has a substantially cylindrical shape, and is made of a material such as aluminum. An inner wall surface of the processing vessel 10 is anodically oxidized. The processing vessel 10 is grounded.

An insulating plate 12 is provided at a bottom portion of the processing vessel 10. The insulating plate 12 is made of, by way of non-limiting example, ceramic. A supporting table 14 is provided on the insulating plate 12. The supporting table 14 has a substantially circular column shape, and a susceptor 16 is provided on the supporting table 14. The susceptor 16 is made of a conductive material such as aluminum, and is configured as a lower electrode (second electrode).

An electrostatic chuck 18 is provided on the susceptor 16. The electrostatic chuck 18 has a structure in which an electrode 20 made of a conductive film is embedded between insulating layers or between insulating sheets. The electrode 20 of the electrostatic chuck 18 is electrically connected to a DC power supply 24 via a switch 22. The electrostatic chuck 18 is configured to generate an electrostatic attracting force by a DC voltage applied from the DC power supply 24, and hold a processing target object W thereon by this electrostatic attracting force. The processing target object W may be a disk-shaped object such as a wafer. A focus ring 26 is disposed on the susceptor 16 to surround the electrostatic chuck 18. Further, a cylindrical inner wall member 28 is disposed on side surfaces of the susceptor 16 and the supporting table 14. This inner wall member 28 is made of, but not limited to, quartz.

A coolant path 30 is formed within the supporting table 14. For example, the coolant path 30 is extended in a spiral shape around a central axis line which is extended in a vertical direction. A coolant cw (for example, cooling water) is supplied through a pipeline 32a into the coolant path 30 from a chiller unit provided at the outside of the processing vessel 10. The coolant supplied into the coolant path 30 is then returned back into the chiller unit via a pipeline 32b. By adjusting a temperature of the coolant through the chiller unit, a temperature of the processing target object W can be adjusted. Further, in the plasma processing apparatus 1, a heat transfer gas (e.g., a He gas) supplied through a gas supply line 34 is introduced into a gap between a top surface of the electrostatic chuck 18 and a rear surface of the processing target object W.

A conductor 44 (e.g., a power feed rod) is connected to the susceptor 16. A high frequency power supply 36, i.e., a first high frequency power supply is connected to the conductor 44 via a matching device 40, i.e., a first matching device, and a high frequency power supply 38, i.e., a second high frequency power supply is also connected to this conductor 44 via a matching device 42, i.e., a second matching device. The high frequency power supply 36 is configured to output a high frequency power RF1 for plasma generation, i.e., a first high frequency power. A basic frequency $f_{B1}$ of the high frequency power RF1 output from the high frequency power supply 36 is, for example, 100 MHz. The high frequency power supply 38 is configured to output a high frequency power RF2 for attracting ions from plasma into the processing target object W, i.e., a second high frequency power. A basic frequency $f_{B2}$ of the high frequency power RF2 output from the high frequency power supply 38 is, for example, 13.56 MHz.

The matching device 40 and the conductor 44 constitute a part of a power feed line 43, i.e., a first power feed line, which is configured to transmit the high frequency power RF1 from the high frequency power supply 36 to the susceptor 16. Further, the matching device 42 and the conductor 44 constitute a part of a power feed line 45, i.e., a second power feed line, which is configured to transmit the high frequency power RF2 from the high frequency power supply 38 to the susceptor 16.

An upper electrode 46 is provided at a ceiling portion of the processing vessel 10. A processing space PS, in which plasma is generated, within the processing vessel 10 is formed between the upper electrode 46 and the susceptor 16. In the exemplary embodiment, a DC power supply 74 is connected to the upper electrode 46. The DC power supply 74 is configured to apply a negative DC voltage DC to the upper electrode 46. The upper electrode 46 has a ceiling plate 48 and a supporting body 50. The ceiling plate 48 is provided with a multiple number of gas discharge holes 48a. The ceiling plate 48 is made of a silicon-based material such as, but not limited to, Si or SiC. The supporting body 50 is a member which supports the ceiling plate 48 in a detachable manner and is made of aluminium. A surface of the supporting body 50 is anodically oxidized.

A gas buffer room 52 is provided within the supporting body 50. Further, the supporting body 50 is provided with a multiple number of gas through holes 50a. The gas through holes 50a are extended from the gas buffer room 52 and communicated with the gas discharge holes 48a, respectively. The gas buffer room 52 is connected with a gas supply system 55 via a gas supply line 54. The gas supply system 55 includes a gas source group 56, a flow rate controller group 58 and a valve group 60. The gas source group 56 includes a plurality of gas sources. The flow rate controller group 58 includes a multiple number of flow rate controllers. Here, the flow rate controllers may be implemented by, by way of non-limiting example, mass flow controllers. Further, the valve group 60 includes a multiple number of valves. Each of the plurality of gas sources of the gas source group 56 is connected to the gas supply line 54 via each corresponding flow rate controller of the flow rate controller group 58 and each corresponding valve of the valve group 60. The gas supply system 55 is configured to supply a gas from a gas source selected from the plurality of gas sources into the gas buffer room 52 at a controlled flow rate. The gas introduced into the gas buffer room 52 is discharged into the processing space PS through the gas discharge holes 48a.

When viewed from the top, an annular space is formed between the susceptor 16 and a sidewall of the processing vessel 10 and between the supporting table 14 and the sidewall of the processing vessel 10. A bottom portion of the corresponding space is connected to an exhaust opening 62 of the processing vessel 10. An exhaust line 64 communicating with the exhaust opening 62 is connected to a bottom portion of the processing vessel 10. The exhaust line 64 is connected to an exhaust device 66. The exhaust device 66 is equipped with a vacuum pump such as a turbo molecular pump, and is configured to decompress the internal space of the processing vessel 10 to a required pressure level. Further, an opening 68 for carry-in/out of the processing target object W is formed at the sidewall of the processing vessel 10. A gate valve 70 for opening/closing the opening 68 is provided at the sidewall of the processing vessel 10.

Further, the plasma processing apparatus 1 is equipped with a main controller 72. The main controller 72 includes one or more microcomputers. The main controller 72 controls operations of individual components of the plasma processing apparatus 1, e.g., the high frequency power supplies 36 and 38, the matching devices 40 and 42, the DC power supply 74, the gas supply system 55 (i.e., the multiple number of flow rate controllers of the flow rate controller group 58 and the multiple number of valves of the valve group 60) and the exhaust device 66, and controls an overall operation of the plasma processing apparatus 1 according to software (programs) and recipe stored in an external memory or an internal memory. Further, the main controller 72 is connected with a manipulation panel for man-machine interface including an input device such as a keyboard and a display device such as a liquid crystal display, and an external memory device configured to store various programs and various data such as recipes and setting values.

A basic operation of the plasma processing apparatus is performed as follows. First, the gate valve 70 is opened, and the processing target object W is carried into the processing vessel 10 through the opening 68. The processing target object W carried into the processing vessel 10 is placed on the electrostatic chuck 18. Then, a gas is introduced into the processing vessel 10 from the gas supply system 55, and the exhaust device 66 is operated so that a pressure in the internal space of the processing vessel 10 is set to a preset pressure value. Further, the high frequency power RF1 from the high frequency power supply 36 is supplied to the susceptor 16, and, when necessary, the high frequency power RF2 from the high frequency power supply 38 is supplied to the susceptor 16. Further, the DC voltage DC from the DC power supply 74 is applied to the upper electrode 46 when necessary. Further, the DC voltage from the DC power supply 24 is applied to the electrode 20 of the electrostatic chuck 18, so that the processing target object W is held on the electrostatic chuck 18. The gas supplied into the processing vessel 10 is excited by high frequency electric field generated between the susceptor 16 and the upper electrode 46. As a result, plasma is generated. The processing target object W is processed by radicals and/or ions from the generated plasma. In addition, in case that the DC voltage DC from the DC power supply 74 is applied to the upper electrode 46, positive ions are attracted to the upper electrode 46 and collide with the upper electrode 46. As a result, secondary electrons are emitted from the upper electrode 46, and/or a material that forms the upper electrode 46, for example, silicon is released from the upper electrode 46.

Figure 2:
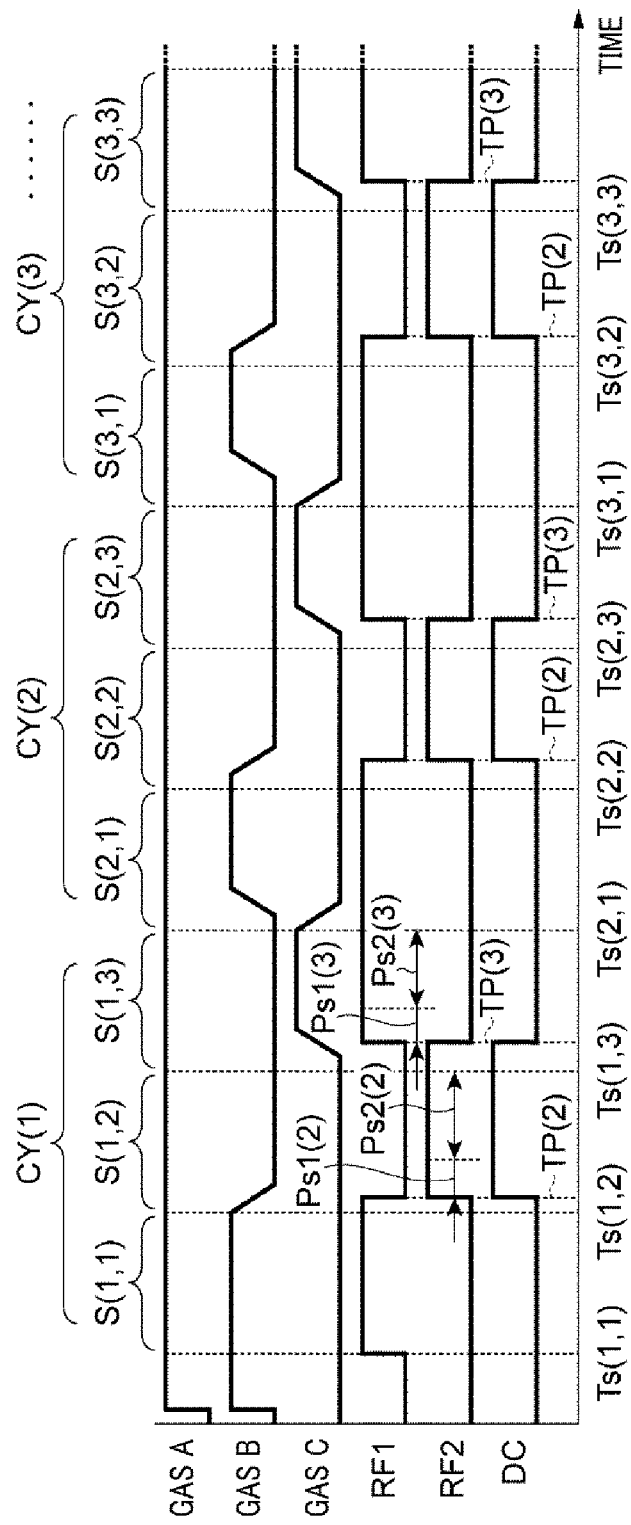
FIG. 2 is an example timing chart for a plasma processing method according to the exemplary embodiment.
Figure 3:
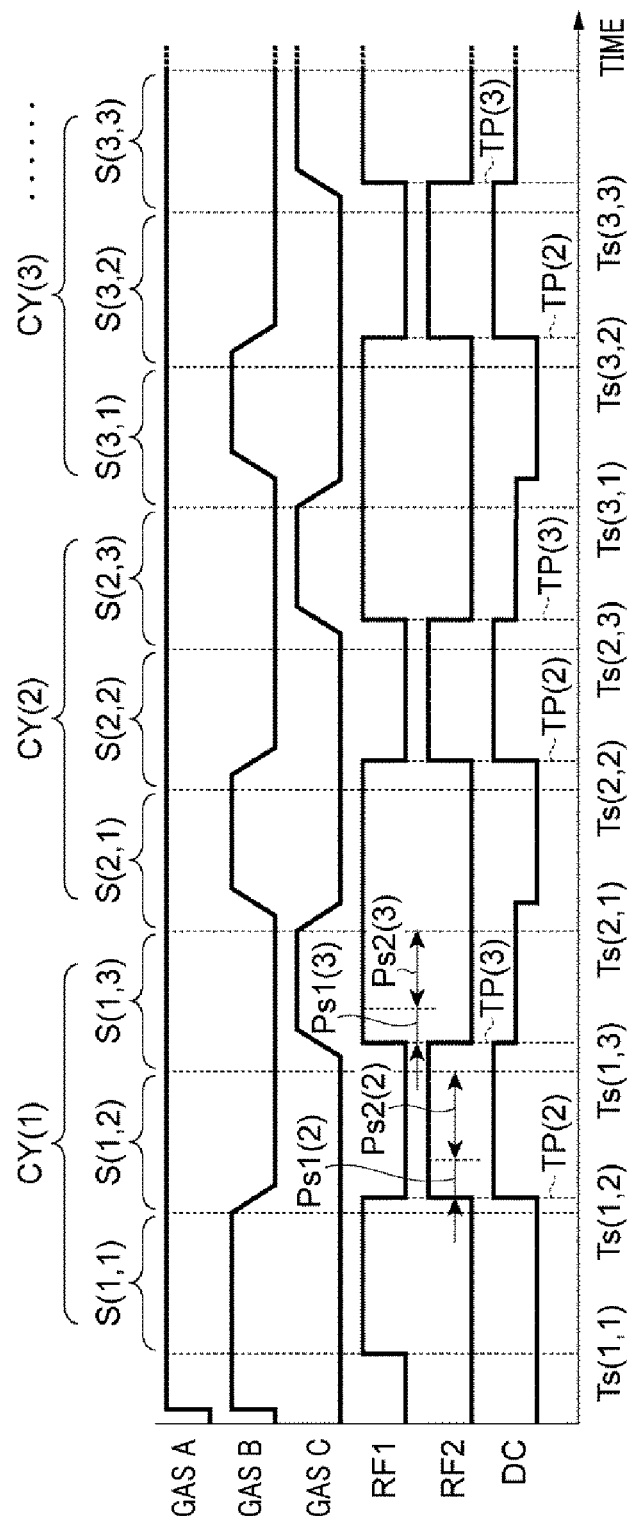
FIG. 3 is another example timing chart for the plasma processing method according to the exemplary embodiment.
Figure 4:
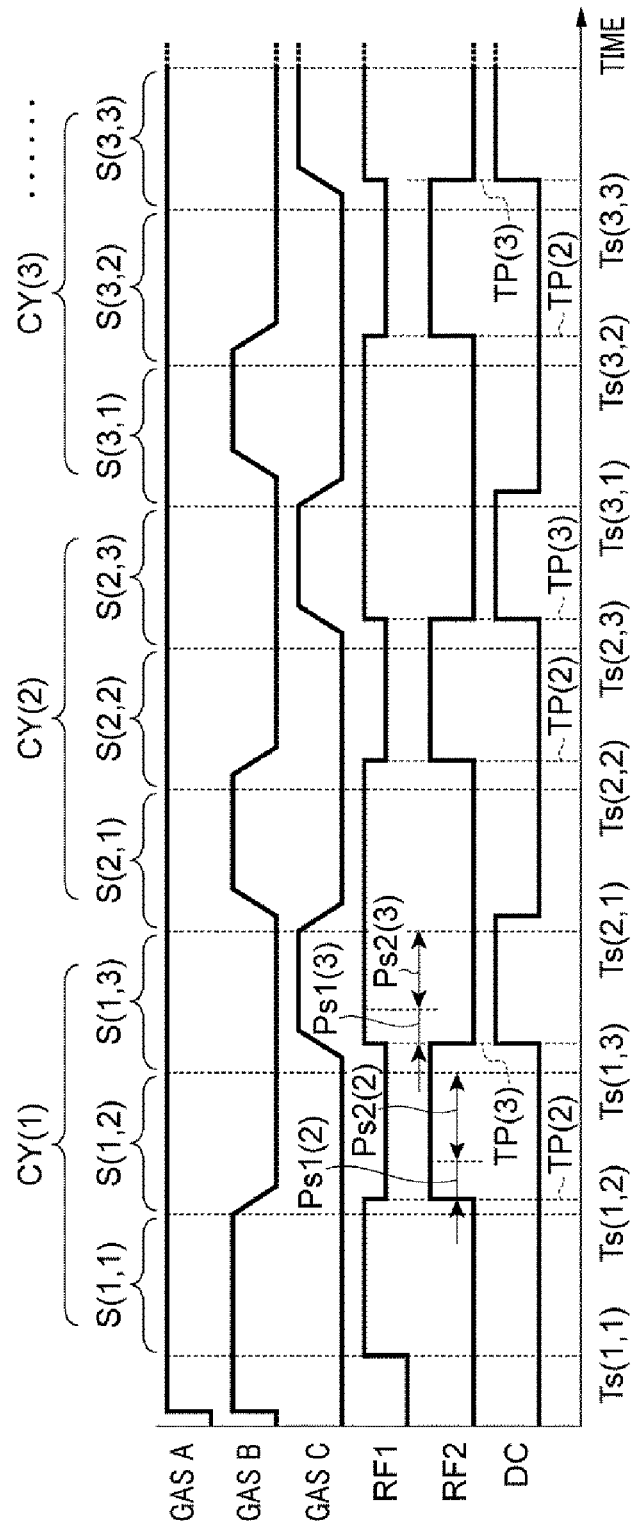
FIG. 4 is a still another example timing chart for the plasma processing method according to the exemplary embodiment.

Now, a plasma processing method according to an exemplary embodiment (hereinafter, referred to as "method MT") will be explained. The method MT can be performed by using the plasma processing apparatus 1. FIG. 2 to FIG. 4 are example timing charts for the plasma processing method according to the exemplary embodiment. In each of FIG. 2 to FIG. 4, timing charts of a gas A, a gas B, a gas C, a high frequency power RF1, a high frequency power RF2 and a DC voltage DC are individually presented. In FIG. 2 to FIG. 4, a horizontal axis represents time. Further, a level of the timing chart of the gas A indicates the amount of the gas A supplied into the processing vessel 10; a level of the timing chart of the gas B represents the amount of the gas B supplied into the processing vessel 10; and a level of the timing chart of the gas C indicates the amount of the gas C supplied into the processing vessel 10. Furthermore, on the timing chart of the high frequency power RF1, a level of the high frequency power RF1 indicates a power level of the high frequency power RF1. Also, on the timing chart of the high frequency power RF2, a level of the high frequency power RF2 indicates a power level of the high frequency power RF2. In addition, on the timing chart of the DC voltage DC, a high level of the DC voltage DC indicates that the DC voltage DC is applied to the upper electrode 46, whereas a low level of the DC voltage DC indicates that the DC voltage DC is not applied to the upper electrode 46 or indicates that the DC voltage DC having a lower level is applied.

As depicted in FIG. 2 to FIG. 4, in the method MT, multiple cycles CY are performed in sequence. Each of the multiple cycles CY includes plural stages S which are performed in sequence. Below, the multiple cycles or each of the multiple cycles will be denoted by "CY". Moreover, a notation of "CY(i)" is used to indicate each of the multiple cycles along with its operation order. The plural stages or each of the plural stages will be denoted by "S". Further, a notation of "S(i, j)" is used to present each of the plural stages S along with its operation order and an operation order of a cycle to which the corresponding stage S belongs. Furthermore, a notation of "S(j)" is used to indicate each of the plural stages along with its operation order. In addition, a notation of "Ts(i, j)" is used to indicate a start time point of each stage. Here, "i" is a variable which indicates an operation order of a cycle. Further, "i" represents an integer equal to or larger than 1 and equal to or smaller than IMAX, and "IMAX" is an integer equal to or larger than 2, which indicates the number of the multiple cycles. Further, "j" is an integer equal to or larger than 1 and equal to or smaller than JMAX, and "JMAX" is an integer equal to or larger than 2, which indicates the number of the plural stages in each cycle CY. Furthermore, in the example shown in FIG. 2 to FIG. 4, JMAX is 3, but not limited thereto.

In the plural stages S belonging to each of the multiple cycles CY of the method MT, plasma of different processing gases is generated. The processing gases respectively used in the plural stages S are specified in a recipe. Further, in each of the plural stages S, a setting of the high frequency power RF1, a setting of the high frequency power RF2 and a level of the DC voltage DC are specified in the recipe. The setting of the high frequency power RF1 includes a setting of a power level of the high frequency power RF1. Likewise, the setting of the high frequency power RF2 includes a setting of a power level of the high frequency power RF2. Further, the setting of the high frequency power RF1 may further include a mode of the high frequency power RF1. Likewise, the setting of the high frequency power RF2 may further include a mode of the high frequency power RF2. The mode of each high frequency power is selected between a continuous wave and a pulse-modulated high frequency power. In addition, the length of a processing time of each of the plural stages S is designated in the recipe. The main controller 72 performs a control for the method MT according to the recipe.

As depicted in FIG. 2 to FIG. 4, in the method MT, prior to a start time point Ts(1, 1) of a stage S(1, 1), i.e., a first stage of the plural stages belonging to a first cycle, the gas supply system 55 starts a supply of a processing gas for the stage S(1, 1). Further, a supply of the high frequency power RF1 to the susceptor 16 is begun at the start time point Ts(1, 1) of the stage S(1, 1).

In the method MT, when transitioning from a preceding stage to a succeeding stage (transitioning from a stage S(i, j−1) to a stage S(i, j) and transitioning from a stage S(i−1, JMAX) to a stage S(i, 1)), that is, at the start time point Ts(i, j) of each stage S, the processing gas supplied by the gas supply system 55 is changed under the control of the main controller 72. In the example shown in FIG. 2 to FIG. 4, in order to generate plasma of a first processing gas containing the gas A and the gas B at a first stage (an example of a first preceding stage), i.e., at a stage S(i, 1), the processing gas supplied by the gas supply system 55 is changed to the first processing gas at a start time point Ts(i, 1). Further, in order to generate plasma of a second processing gas containing the gas A at a second stage (an example of a first succeeding stage and a second preceding stage), i.e., at a stage S(i, 2), the processing gas supplied by the gas supply system 55 is changed to the second processing gas at a start time point Ts(i, 2). Furthermore, in order to generate plasma of a third processing gas containing the gas A and the gas C at a third stage (an example of a second succeeding stage), i.e., at a stage S(i, 3), the processing gas supplied by the gas supply system 55 is changed to the third processing gas at a start time point Ts(i, 3). By way of example, but not limitation, the gas A may be a rare gas such as Ar; the gas B, a fluorocarbon gas; and the gas C, an oxygen gas.

In the method MT, a parameter used to determine a time point when changing the setting of the high frequency power after the gas supplied from the gas supply system 55 is changed may be different between two cases where the high frequency power RF1 is supplied to the susceptor 16 and the power level of the high frequency power RF2 is set to be low (for example, the power level of the high frequency power RF2 is set to be zero) in a preceding stage and where the high frequency power RF2 is supplied to the susceptor 16 and the power level of the high frequency power RF1 is set to be low (for example, the power level of the high frequency power RF1 is set to be zero) in a preceding stage.

First, assume that the high frequency power RF1 is supplied to the susceptor 16 and the power level of the high frequency power RF2 is set to be low in a preceding stage S(i, j−1). In this case, the high frequency power RF1 is continuously supplied at least up to a time point TP(j) within a processing time of a succeeding stage S(i, j). Further, after a start time point Ts(i, j) of the stage S(i, j), that is after the processing gas supplied by the gas supply system 55 is changed, the power level of the high frequency power RF2 is increased for the stage S(i, j) at the time point TP(j) when a first parameter related to the high frequency power RF1 to be descried later exceeds a threshold value Th1(j). For example, the high frequency power RF2, which is not supplied to the susceptor 16 before the time point TP(j), is supplied to the susceptor 16 from the time point TP(j). The setting of the high frequency power RF1 may be changed at the time point TP(j). For instance, the supply of the high frequency power RF1 to the susceptor 16 may be stopped from the time point TP(j). Alternatively, the power level of the high frequency power RF1 supplied to the susceptor 16 may be reduced from the time point TP(j). Furthermore, at the time point TP(j), the level (absolute value) of the DC voltage DC may be changed.

Now, assume that the high frequency power RF2 is supplied to the susceptor 16 and the power level of the high frequency power RF1 is set to be low in a preceding stage S(i, j−1). In this case, the high frequency power RF2 is continuously supplied at least up to a time point TP(j) within a processing time of a succeeding stage S(i, j). Further, after a start time point Ts(i, j) of the stage S(i, j), that is, after the processing gas supplied by the gas supply system 55 is changed, the power level of the high frequency power RF1 is increased for the stage S(i, j) at the time point TP(j) when a second parameter related to the high frequency power RF2 to be described later exceeds a threshold value Th2(j). For example, the high frequency power RF1, which is not supplied to the susceptor 16 before the time point TP(j), is supplied to the susceptor 16 from the time point TP(j). The setting of the high frequency power RF2 may be changed at the time point TP(j). For instance, the supply of the high frequency power RF2 to the susceptor 16 may be stopped from the time point TP(j). Alternatively, the power level of the high frequency power RF2 supplied to the susceptor 16 may be reduced from the time point TP(j). Furthermore, at the time point TP(j), the level (absolute value) of the DC voltage DC may be changed.

In the example shown in FIG. 2, the high frequency power RF1 is supplied to the susceptor 16 in a stage S(i, 1), and the supply of the high frequency power RF1 to the susceptor 16 is stopped at a time point TP(2) within a processing time of the stage S(i, 2). Further, the high frequency power RF2 is not supplied to the susceptor 16 in the stage S(i, 1), and the supply of the high frequency power RF2 to the susceptor 16 is begun at the time point TP(2) within the processing time of the stage S(i, 2). Furthermore, the DC voltage DC is not applied to the upper electrode 46 in the stage S(i, 1), and the application of the DC voltage DC to the upper electrode 46 is started at the time point TP(2) within the processing time of the stage S(i, 2). Further, at a time point TP(3) within a processing time of a stage S(i, 3), the supply of the high frequency power RF1 to the susceptor 16 is begun whereas the supply of the high frequency power RF2 to the susceptor 16 is stopped. Moreover, the application of the DC voltage DC to the upper electrode 46 is stopped at the time point TP(3) within the processing time of the stage S(i, 3). In addition, in the example shown in FIG. 2, even when transitioning from a stage S(i−1, 3) to the stage S(i, 1), the setting of the high frequency power RF1, the setting of the high frequency power RF2 and the level of the DC voltage DC are not changed in the corresponding stage S(i, 1).

In the example shown in FIG. 3, the DC voltage DC is continuously supplied to the upper electrode from the stage S(i, 2) to the stage S(i, 3), and the level of the DC voltage DC is lowered at the time point TP(3) within the processing time of the stage S(i, 3). Other details regarding the change of the setting of the high frequency power RF1, the change of the setting of the high frequency power RF2 and the change of the level of the DC voltage DC are the same as those in the example shown in FIG. 2.

In the example shown in FIG. 4, though the high frequency power RF1 is continuously supplied to the susceptor 16 from the stage S(i, 1) to the stage S(i, 2), the power level of the high frequency power RF1 is reduced at the time point TP(2) in the stage S(i, 2). Further, the application of the DC voltage DC to the upper electrode 46 is kept stopped from the stage S(i, 1) to the stage S(i, 2), and the application of the DC voltage DC to the upper electrode 46 is begun at the time point TP(3) within the processing time of the stage S(i, 3). Other details regarding the change of the setting of the high frequency power RF1, the change of the setting of the high frequency power RF2 and the change of the level of the DC voltage DC are the same as those in the example of FIG. 2.

Figure 5:
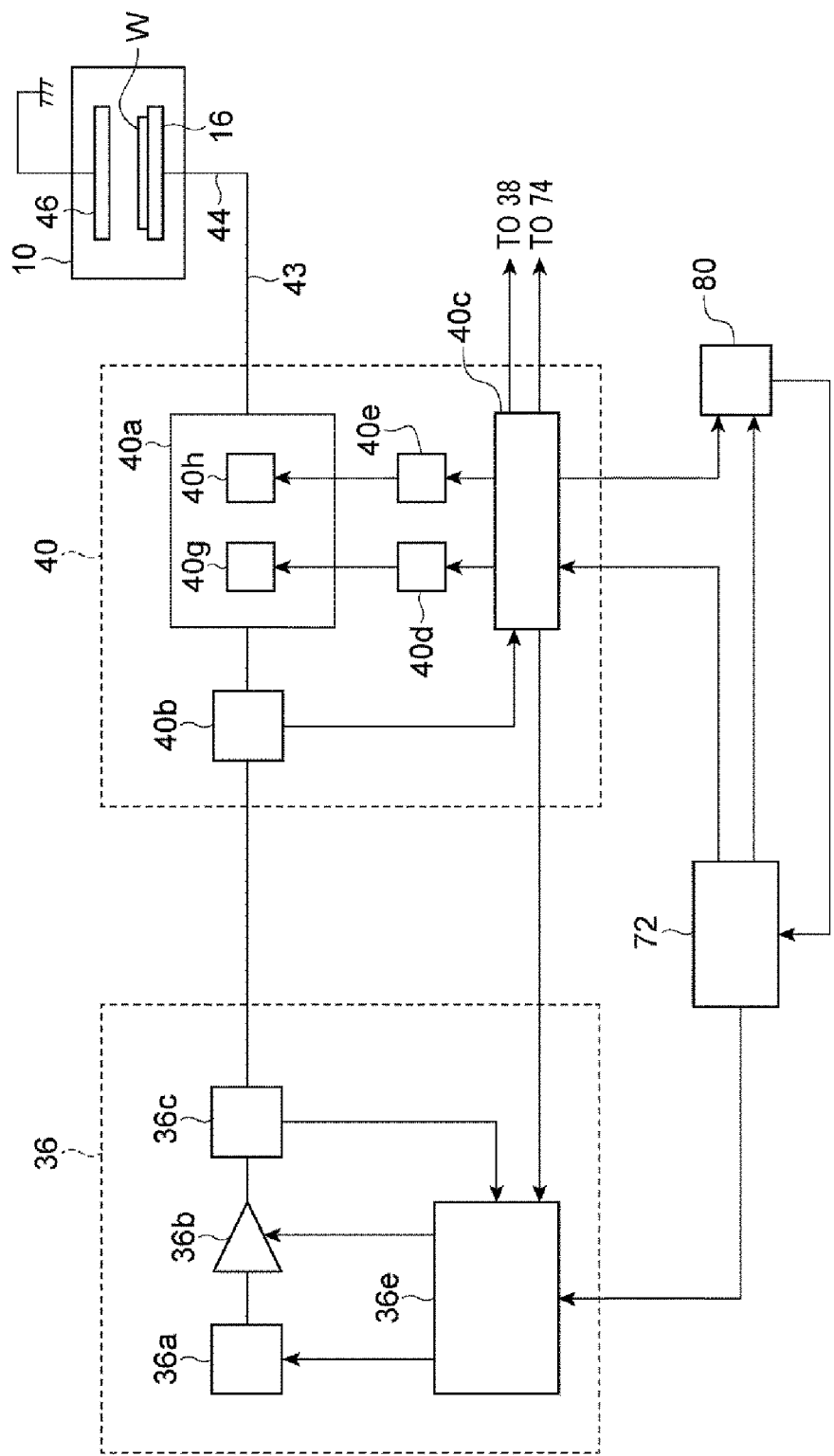
FIG. 5 is a diagram illustrating an example configuration of a first high frequency power supply and a first matching device.
Figure 6:
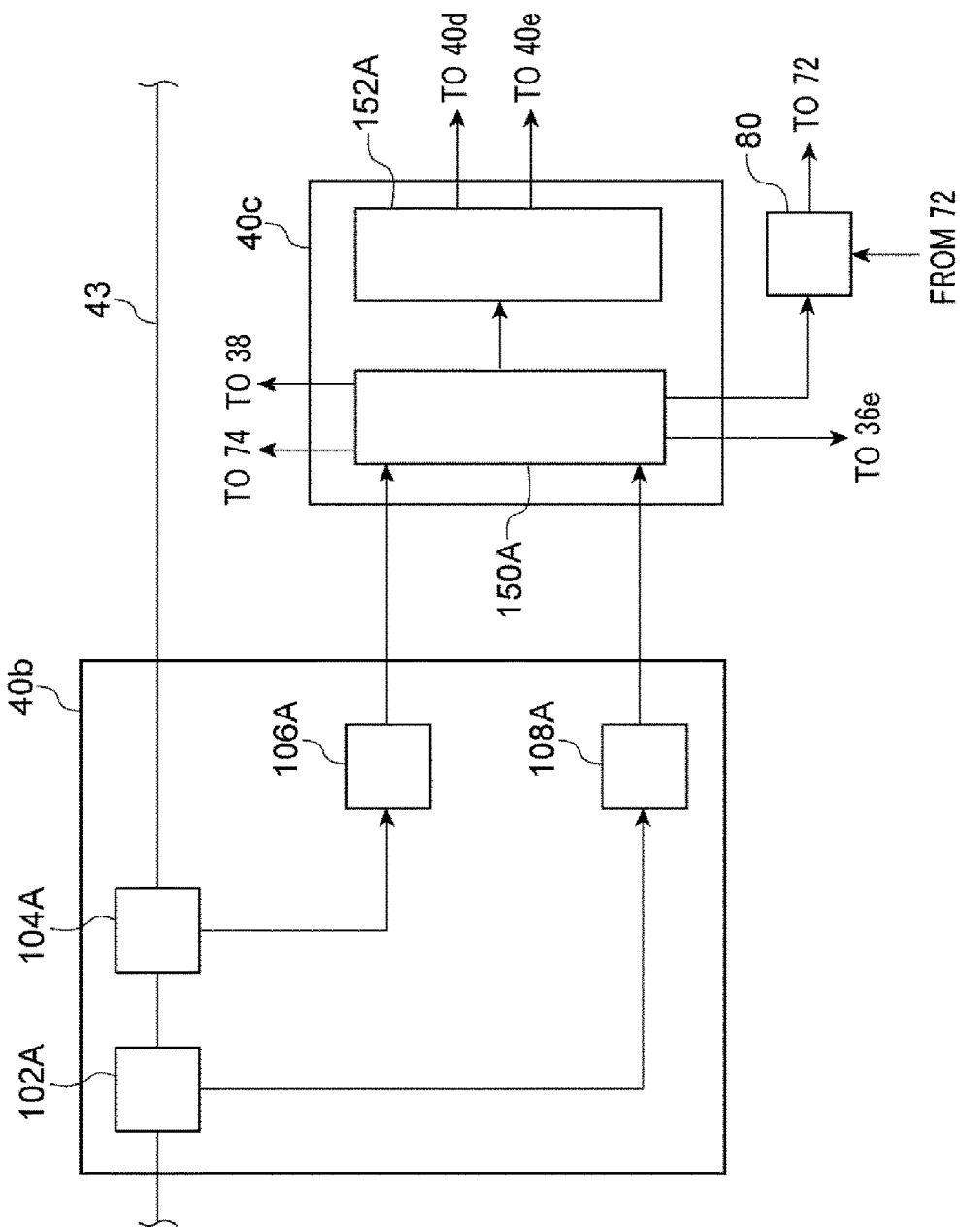
FIG. 6 is a diagram illustrating an example configuration of a sensor and a controller of the first matching device.
Figure 7:
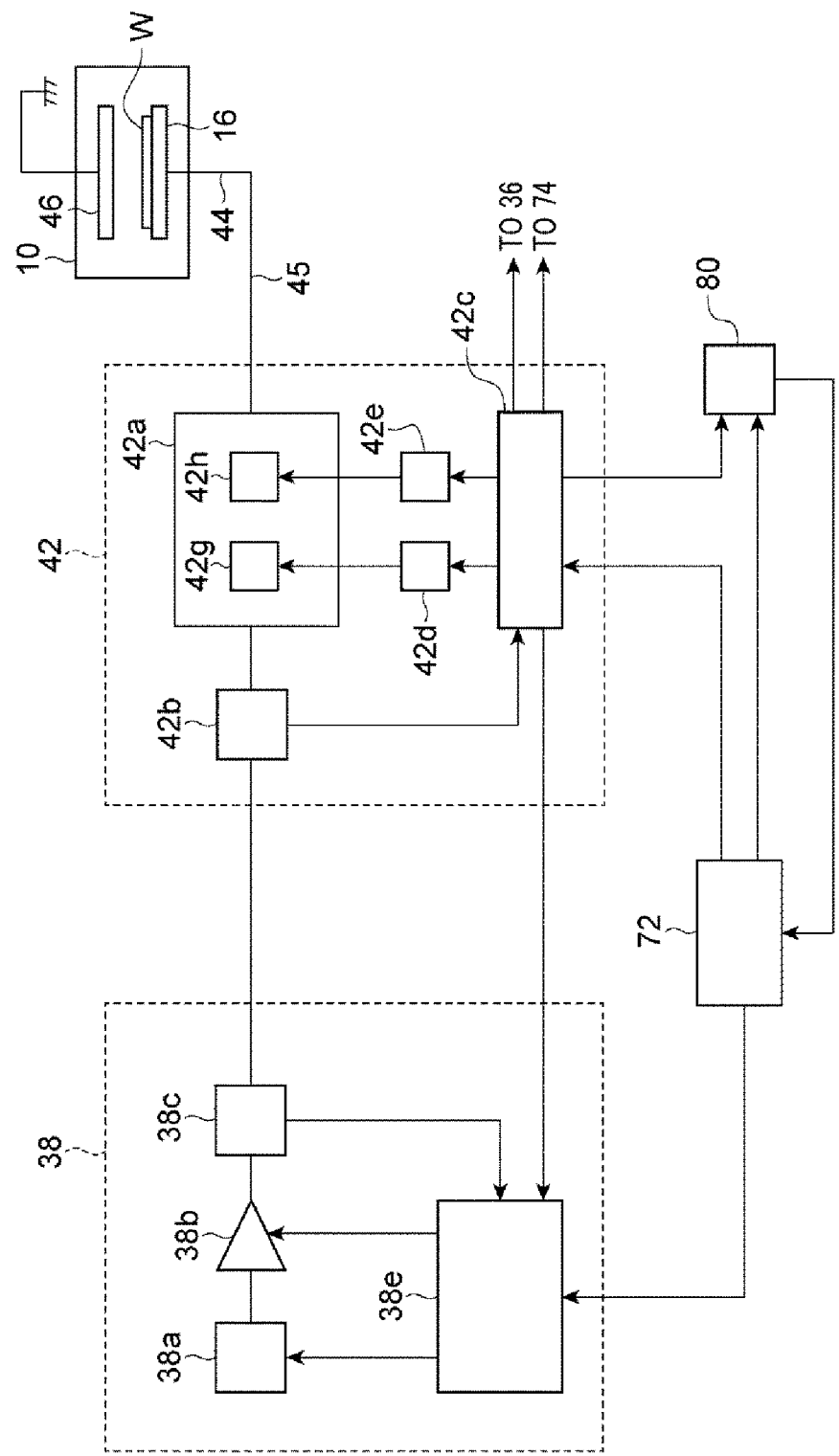
FIG. 7 is a diagram illustrating an example configuration of a second high frequency power supply and a second matching device.
Figure 8:
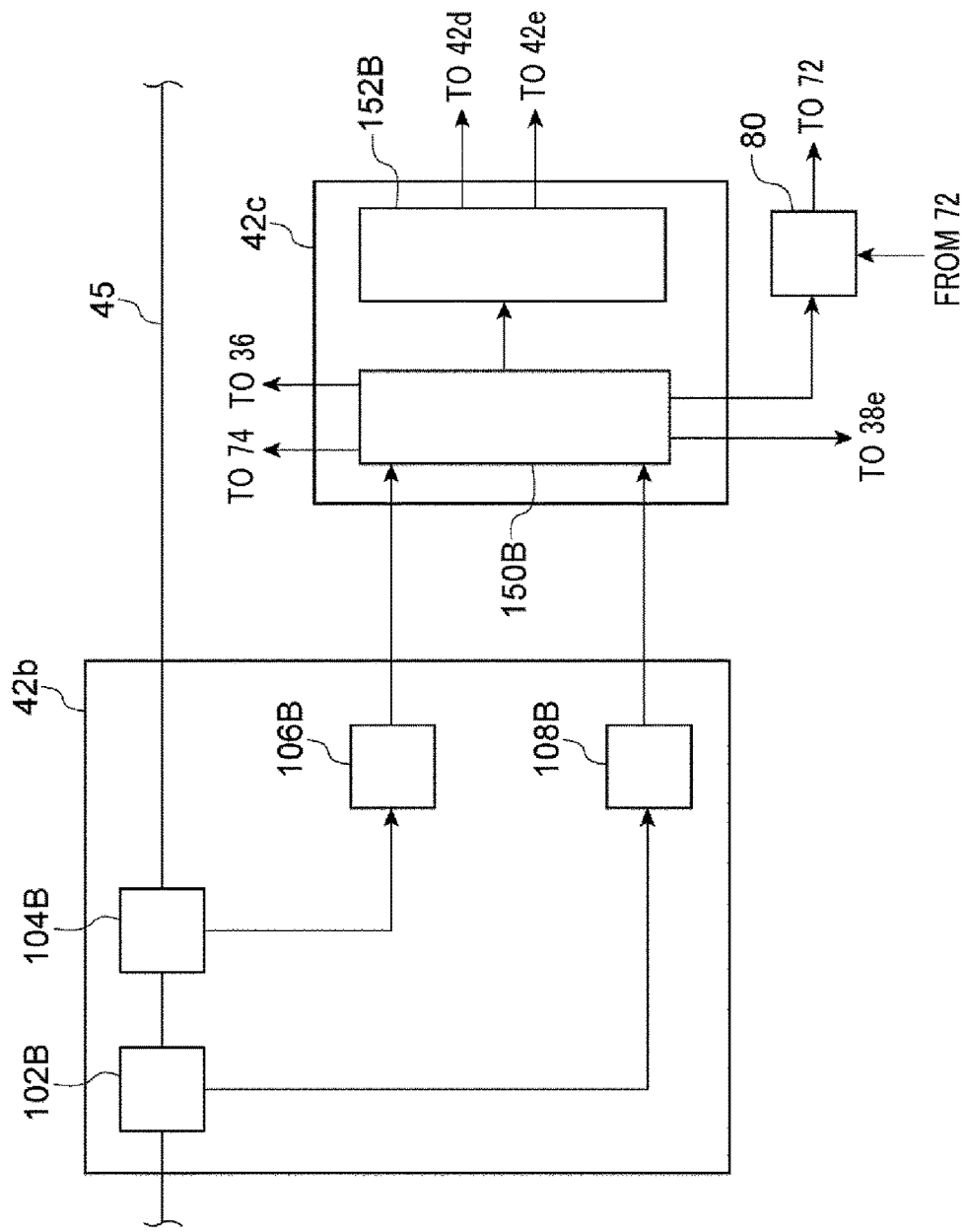
FIG. 8 is a diagram illustrating an example configuration of a sensor and a controller of the second matching device.

In the exemplary embodiment, the aforementioned first parameter is calculated by an operation unit 150A (first operation unit) of the matching device 40, and the aforementioned second parameter is calculated by an operation unit 150B (second operation unit) of the matching device 42. Below, referring to FIG. 5 to FIG. 8, the high frequency power supply 36, the matching device 40, the high frequency power supply 38 and the matching device 42 will be elaborated in detail. FIG. 5 is a diagram illustrating an example configuration of the high frequency power supply 36 and the matching device 40, and FIG. 6 is a diagram illustrating an example configuration of a sensor and a controller of the matching device 40. FIG. 7 is a diagram illustrating an example configuration of the high frequency power supply 38 and the matching device 42, and FIG. 8 is a diagram illustrating an example configuration of a sensor and a controller of the matching device 42.

According to the exemplary embodiment, the high frequency power supply 36 includes an oscillator 36a, a power amplifier 36b, a power sensor 36c and a power supply controller 36e, as shown in FIG. 5. The power supply controller 36e is composed of a processor such as a CPU, and controls the oscillator 36a and the power amplifier 36b by applying control signals to the oscillator 36a and the power amplifier 36b individually through the use of a signal applied from the main controller 72 and a signal applied from the power sensor 36c.

A signal applied to the power supply controller 36e from the main controller 72 is a first high frequency power setting signal which is generated according to a recipe. The first high frequency power setting signal is a signal which designates the setting of the high frequency power RF1. In the examples of FIG. 2 to FIG. 4, the first high frequency power setting signal is applied to the power supply controller 36e from the main controller 72 such that the high frequency power RF1 having the setting designated by the first high frequency power setting signal is begun to be supplied by the high frequency power supply 36 at the start time point of the stage S(1, 1). Further, the first high frequency power setting signal is applied from the main controller 72 to the power supply controller 36e when the setting of the high frequency power RF1 is changed in a stage S(i, j) which is performed after the stage S(1, 1). In response to a signal from the operation unit 150A or a signal from the operation unit 150B to be described later, the power supply controller 36e is operated to control the high frequency power supply 36 to output the high frequency power RF1 having the setting designated by the first high frequency power setting signal. Alternatively, in case that the first high frequency power setting signal designates stopping the high frequency power RF1, the power supply controller 36e stops the output of the high frequency power RF1 from the high frequency power supply 36 in response to the signal from the operation unit 150A or the signal from the operation unit 150B.

In case that the power level of the high frequency power RF1 designated by the first high frequency power setting signal is higher than zero (0), the power supply controller 36e controls the oscillator 36a to output a high frequency power having a frequency designated by the first high frequency power setting signal. An output of the oscillator 36a is connected to an input of the power amplifier 36b. The high frequency power output from the oscillator 36a is input to the power amplifier 36b. The power amplifier 36b amplifies the input high frequency power to output the high frequency power RF1 having the power designated by the first high frequency power setting signal from an output thereof. Accordingly, the high frequency power RF1 is output from the high frequency power supply 36.

The power sensor 36c is provided at a rear end of the power amplifier 36b. The power sensor 36c is equipped with a directional coupler, a progressive wave power detector and a reflection wave power detector. The directional coupler sends a part of a progressive wave of the high frequency power RF1 to the progressive wave power detector, and sends a reflection wave to the reflection wave power detector. A signal specifying the frequency of the high frequency power RF1 is applied to this power sensor 36c from the power supply controller 36e. The progressive wave power detector generates a measurement value of a power of a component having the same frequency as the frequency of the high frequency power RF1 among all frequency components of the progressive wave, i.e., generates a progressive wave power measurement value PF1. This progressive wave power measurement value is sent to the power supply controller 36e for power feedback.

The reflection wave power detector generates a measurement value of a power of a component having the same frequency as the frequency of the high frequency power RF1 among all frequency components of the reflection wave, i.e., generates a reflection wave power measurement value PR11, and also generates a measurement value of a total power of the all frequency components of the reflection wave, i.e., generates a reflection wave power measurement value PR12. The reflection wave power measurement value PR11 is sent to the main controller 72 for monitor display. Further, the reflection wave power measurement value PR12 is sent to the power supply controller 36e for protection of the power amplifier 36b.

Further, a DC voltage setting signal is applied to the DC power supply 74 from the main controller 72. The DC voltage setting signal is a signal that designates the level of the DC voltage DC. The DC voltage setting signal is applied from the main controller 72 to the DC power supply 74 when changing the level of the DC voltage DC in the stage S(i, j). In response to the signal from the operation unit 150A or the signal from the operation unit 150B to be described later, the DC power supply 74 is operated to output a DC voltage DC having a level designated by the DC voltage setting signal. Alternatively, in case that the level of the DC voltage DC designated by the DC voltage setting signal is zero (0), the DC power supply 74 is operated to stop the output of the DC voltage DC in response to the signal from the operation unit 150A or the signal from the operation unit 150b to be described later.

As shown in FIG. 5, the matching device 40 is equipped with a matching circuit 40a, a sensor 40b, a controller 40c and actuators 40d and 40e. The matching circuit 40a includes variable reactance elements 40g and 40h. The variable reactance elements 40g and 40h may be implemented by, but not limited to, variable capacitors. Further, the matching circuit 40a may further include an inductor or the like.

The controller 40c is composed of, for example, a processor, and is operated under the control of the main controller 72. When the high frequency power RF1 is supplied to the susceptor 16, the controller 40c is configured to calculate a load impedance of the high frequency power supply 36 by using a measurement value sent from the sensor 40b. Further, the controller 40c is also configured to adjust a reactance of each of the variable reactance elements 40g and 40h by controlling the actuators 40d and 40e such that the calculated load impedance approximates to a matching point or an output impedance of the high frequency power supply 36. Each of the actuators 40d and 40e is implemented by, for example, a motor.

Further, in case that the high frequency power RF1 is supplied to the susceptor 16 and the power level of the high frequency power RF2 is set to be low in a preceding stage S(j-1), the controller 40c calculates the first parameter to be described later by using the measurement value sent from the sensor 40b and determines a time point TP(j) within a processing time of a succeeding stage S(j).

As depicted in FIG. 6, the sensor 40b includes a current detector 102A, a voltage detector 104A, a filter 106A and a filter 108A. The voltage detector 104A is configured to detect a voltage waveform of the high frequency power RF1 transmitted on the power feed line 43 and is configured to output a voltage waveform analog signal indicating the corresponding voltage waveform. This voltage waveform analog signal is input to the filter 106A. The filter 106A is configured to generate a voltage waveform digital signal by digitizing the voltage waveform analog signal input thereto. Further, the filter 106A is configured to generate a filtered voltage waveform signal by extracting, from the voltage waveform digital signal, only a component having a set frequency of the high frequency power RF1 specified by the signal from the main controller 72. The filtered voltage waveform signal generated by the filter 106A is sent to an operation unit 150A of the controller 40c. Further, the filter 106A may be composed of, by way of non-limiting example, a FPGA (Field Programmable Gate Array).

The current detector 102A is configured to detect a current waveform of the high frequency power RF1 transmitted on the power feed line 43 and is configured to output a current waveform analog signal indicating the corresponding current waveform. This current waveform analog signal is input to the filter 108A. The filter 108A is configured to generate a current waveform digital signal by digitizing the current waveform analog signal input thereto. Further, the filter 108A is configured to generate a filtered current waveform signal by extracting, from the current waveform digital signal, only a component having the set frequency of the high frequency power RF1 specified by the signal from the main controller 72. The filtered current waveform signal generated by the filter 108A is sent to the operation unit 150A of the controller 40c. Further, the filter 108A may be composed of, by way of non-limiting example, a FPGA (Field Programmable Gate Array).

In order to achieve impedance matching in the matching device 40, the operation unit 150A of the controller 40c calculates a load impedance ZL1 of the high frequency power supply 36 by using the filtered voltage waveform signal sent from the filter 106A and the filtered current waveform signal sent from the filter 108A. To elaborate, the operation unit 150A calculates the load impedance ZL1 of the high frequency power supply 36 from an alternating voltage V1 specified by the filtered voltage waveform signal, an alternating current I1 specified by the filtered current waveform signal, and a phase difference $\phi 1$ between the alternating voltage V1 and the alternating current I1. Further, the operation unit 150A is also configured to calculate the first parameter from the alternating voltage V1, the alternating current I1 and the phase difference $\phi 1$. The first parameter may be the aforementioned load impedance ZL1. In this case, since the load impedance calculated for the impedance matching of the matching device 40 can be used as the first parameter, it is not required to calculate the first parameter additionally. Alternatively, the first parameter may be any one of a load resistance Zr1, a load reactance Zi1 and a reflection wave coefficient $\Gamma 1$.

The load impedance ZL1 is calculated as V1/I1. The load resistance Zr1 is obtained by calculating a real part of the load impedance ZL1, and the load reactance Zi1 is obtained by calculating an imaginary part of the load impedance ZL1. Further, the reflection wave coefficient $\Gamma 1$ is calculating by the following Expression 1.

[Expression 1]

$$\Gamma 1 = \frac{\sqrt{(Zr1-50)^2 + (Zi1)^2}}{(Zr1+50)^2 + (Zi1)^2} \quad (1)$$

Further, the reflection wave coefficient Γ1 may also be calculated as PR11/PF1 by using the progressive wave power measurement value PF1 and the reflection wave power measurement value PR11 obtained by the power sensor 36c.

The operation unit 150A is configured to output the calculated load impedance ZL1 to a matching controller 152A. The matching controller 152A is configured to adjust the reactance of the variable reactance elements 40g and 40h by controlling the actuators 40d and 40e such that the load impedance ZL1 approximates to the output impedance of the high frequency power supply 36 (or the matching point). Accordingly, the impedance matching by the matching device 40 is performed. Further, the matching controller 152A may control the actuators 40d and 40e such that a moving average value of series of the load impedance ZL1 output by the operation unit 150A approximates to the output impedance of the high frequency power supply 36 (or the matching point).

Further, in case that the high frequency power RF1 is supplied to the susceptor 16 and the power level of the high frequency power RF2 is set to be low in a preceding stage, the operation unit 150A determines whether the calculated first parameter exceeds a corresponding threshold value Th1(j) from when the processing gas supplied from the gas supply system 55 is changed for a succeeding stage S(j). Initially, the threshold value Th1(j) is set as a preset value indicating that the processing gas within the processing vessel 10 is switched. If the first parameter exceeds the threshold value Th1(j), the operation unit 150A applies signals to the power supply controller 36e, the high frequency power supply 38 (power supply controller 38e) and the DC power supply 74. In case that the first high frequency power setting signal is applied from the main controller 72, the power supply controller 36e changes the setting of the high frequency power RF1 according to the first high frequency power setting signal in response to the signal from the operation unit 150A. That is, in case that the first high frequency power setting signal is applied from the main controller 72, the high frequency power supply 36 changes the setting of the high frequency power RF1 (e.g., decreases the power level of the high frequency power RF1) according to the first high frequency power setting signal at a time point when the first parameter exceeds the threshold value Th1(j).

Furthermore, in case that a second high frequency power setting signal to be described later is applied from the main controller 72, the power supply controller 38e of the high frequency power supply 38 changes the setting of the high frequency power RF2 according to the second high frequency power setting signal in response to the signal from the operation unit 150A. That is, in case that the second high frequency power setting signal is applied from the main controller 72, the high frequency power supply 38 changes the setting of the high frequency power RF2 (e.g., increases the power level of the high frequency power RF2) according to the second high frequency power setting signal at the time point when the first parameter exceeds the threshold value Th1(j).

Further, in case that the DC voltage setting signal is applied from the main controller 72 in the stage S(j), the DC power supply 74 changes the level of the DC voltage DC to a level designated by the DC voltage setting signal in response to the signal from the operation unit 150A. That is, in case that the DC voltage setting signal is applied from the main controller 72 in the stage S(j), the DC power supply 74 changes the level of the DC voltage DC to the level designated by the DC voltage setting signal at the time point when the first parameter exceeds the threshold value Th1(j).

Furthermore, the operation unit 150A sends, to a time adjusting unit 80, first information which specifies the time point when the first parameter exceeds the threshold value Th1(j) in the stage S(j). This time adjusting unit 80 may be implemented by, but not limited to, a processor such as a CPU. The time adjusting unit 80 also receives, from the main controller 72, second information specifying a time point when transitioning to the stage S(i, j), i.e., the start time point Ts(i, j). The time adjusting unit 80 calculates a first time difference between the time point specified by the first information and the time point specified by the second information. Then, the time adjusting unit 80 sends, to the main controller 72, first time difference specifying information which specifies this first time difference. The main controller 72 adjusts a stage S(j) of a subsequent (e.g., next) cycle CY to be increased from a preset processing time of the corresponding stage S(j) designated in the recipe by the first time difference specified in the first time difference specifying information.

Now, reference is made to FIG. 7. As shown in FIG. 7, according to the exemplary embodiment, the high frequency power supply 38 includes an oscillator 38a, a power amplifier 38b, a power sensor 38c and a power supply controller 38e. The power supply controller 38e is composed of a processor such as a CPU, and controls the oscillator 38a and the power amplifier 38b by applying control signals to the oscillator 38a and the power amplifier 38b individually through the use of a signal applied from the main controller 72 and a signal applied from the power sensor 38c.

A signal applied to the power supply controller 38e from the main controller 72 is a second high frequency power setting signal which is generated according to a recipe. The second high frequency power setting signal is a signal which designates the setting of the high frequency power RF2. The second high frequency power setting signal is applied from the main controller 72 to the power supply controller 38e when the setting of the high frequency power RF2 is changed in the stage S(i, j). In response to the signal from the operation unit 150A or the signal from the operation unit 150B, the power supply controller 38e is operated to control the high frequency power supply 38 to output the high frequency power RF2 having the setting designated by the second high frequency power setting signal. Alternatively, in case that the second high frequency power setting signal designates stopping the high frequency power RF2, the power supply controller 38e stops the output of the high frequency power RF2 from the high frequency power supply 38 in response to the signal from the operation unit 150A or the signal from the operation unit 150B.

In case that the power level of the high frequency power RF2 designated by the second high frequency power setting signal is higher than zero (0), the power supply controller 38e controls the oscillator 38a to output a high frequency power having a frequency designated by the second high frequency power setting signal. An output of the oscillator 38a is connected to an input of the power amplifier 38b. The high frequency power output from the oscillator 38a is input to the power amplifier 38b. The power amplifier 38b amplifies the input high frequency power to output the high frequency power RF2 having a power designated by the second high frequency power setting signal from the output thereof. Accordingly, the high frequency power RF2 is output from the high frequency power supply 38.

The power sensor 38c is provided at a rear end of the power amplifier 38b. The power sensor 38c is equipped with a directional coupler, a progressive wave power detector and a reflection wave power detector. The directional coupler sends a part of a progressive wave of the high frequency power RF2 to the progressive wave power detector, and sends a reflection wave to the reflection wave power detector. A signal specifying the frequency of the high frequency power RF2 is applied to this power sensor 38c from the power supply controller 38e. The progressive wave power detector generates a measurement value of a power of a component having the same frequency as the frequency of the high frequency power RF2 among all frequency components of the progressive wave, i.e., generates a progressive wave power measurement value PF2. This progressive wave power measurement value is sent to the power supply controller 38e for power feedback.

The reflection wave power detector generates a measurement value of a power of a component having the same frequency as the frequency of the high frequency power RF2 among all frequency components of the reflection wave, i.e., generates a reflection wave power measurement value PR21, and also generates a measurement value of a total power of the all frequency components of the reflection wave, i.e., generates a reflection wave power measurement value PR22. The reflection wave power measurement value PR21 is sent to the main controller 72 for monitor display. Further, the reflection wave power measurement value PR22 is sent to the power supply controller 38e for protection of the power amplifier 38b.

As shown in FIG. 7, the matching device 42 is equipped with a matching circuit 42a, a sensor 42b, a controller 42c and actuators 42d and 42e. The matching circuit 42a includes variable reactance elements 42g and 42h. The variable reactance elements 42g and 42h may be implemented by, but not limited to, variable capacitors. Further, the matching circuit 42a may further include an inductor or the like.

The controller 42c is composed of, for example, a processor, and is operated under the control of the main controller 72. When the high frequency power RF2 is supplied to the susceptor 16, the controller 42c is configured to calculate a load impedance of the high frequency power supply 38 by using a measurement value sent from the sensor 42b. Further, the controller 42c is also configured to adjust a reactance of each of the variable reactance elements 42g and 42h by controlling the actuators 42d and 42e such that the calculated load impedance approximates to a matching point or an output impedance of the high frequency power supply 38. Each of the actuators 42d and 42e is implemented by, for example, a motor.

Further, in case that the high frequency power RF2 is supplied to the susceptor 16 and the power level of the high frequency power RF1 is set to be low in a preceding stage S(j−1), the controller 42c calculates the second parameter to be described later by using a measurement value sent from the sensor 42b and determines a time point TP(j) within a processing time of a succeeding stage S(j).

As depicted in FIG. 8, the sensor 42b includes a current detector 102B, a voltage detector 104B, a filter 106B and a filter 108B. The voltage detector 104B is configured to detect a voltage waveform of the high frequency power RF2 transmitted on the power feed line 45, and is configured to output a voltage waveform analog signal indicating the corresponding voltage waveform. This voltage waveform analog signal is input to the filter 106B. The filter 106B is configured to generate a voltage waveform digital signal by digitizing the voltage waveform analog signal input thereto. Further, the filter 106B is configured to generate a filtered voltage waveform signal by extracting, from the voltage waveform digital signal, only a component having a set frequency of the high frequency power RF2 specified by the signal from the main controller 72. The filtered voltage waveform signal generated by the filter 106B is sent to an operation unit 1506 of the controller 42c. Further, the filter 106B may be composed of, by way of non-limiting example, a FPGA (Field Programmable Gate Array).

The current detector 102B is configured to detect a current waveform of the high frequency power RF2 transmitted on the power feed line 45, and is configured to output a current waveform analog signal indicating the corresponding current waveform. This current waveform analog signal is input to the filter 108B. The filter 108B is configured to generate a current waveform digital signal by digitizing the current waveform analog signal input thereto. Further, the filter 108B is configured to generate a filtered current waveform signal by extracting, from the current waveform digital signal, only a component having the set frequency of the high frequency power RF2 specified by the signal from the main controller 72. The filtered current waveform signal generated by the filter 108B is sent to the operation unit 1506 of the controller 42c. Further, the filter 108B may be composed of, by way of non-limiting example, a FPGA (Field Programmable Gate Array).

In order to achieve impedance matching in the matching device 42, the operation unit 1506 of the controller 42c calculates a load impedance ZL2 of the high frequency power supply 38 by using the filtered voltage waveform signal sent from the filter 106B and the filtered current waveform signal sent from the filter 108B. To elaborate, the operation unit 1506 calculates the load impedance ZL2 of the high frequency power supply 38 from an alternating voltage V2 specified by the filtered voltage waveform signal, an alternating current I2 specified by the filtered current waveform signal, and a phase difference φ2 between the alternating voltage V2 and the alternating current I2. Further, the operation unit 150B is also configured to calculate the second parameter from the alternating voltage V2, the alternating current I2 and the phase difference φ2. The second parameter may be the aforementioned load impedance ZL2. In this case, since the load impedance calculated for the impedance matching of the matching device 42 can be used as the second parameter, it is not required to calculate the second parameter additionally. Alternatively, the second parameter may be any one of a load resistance Zr2, a load reactance Zi2 and a reflection wave coefficient Γ 2.

The load impedance ZL2 is calculated as V2/I2. The load resistance Zr2 is obtained by calculating a real part of the load impedance ZL2, and the load reactance Zi2 is obtained by calculating an imaginary part of the load impedance ZL2. Further, the reflection wave coefficient Γ 2 is calculating by the following Expression 2.

[Expression 2]

$$\Gamma 2 = \frac{\sqrt{(Zr2 - 50)^2 + (Zi2)^2}}{(Zr2 + 50)^2 + (Zi2)^2} \quad (2)$$

Further, the reflection wave coefficient Γ 2 may also be calculated as PR21/PF2 by using the progressive wave power measurement value PF2 and the reflection wave power measurement value PR21 obtained by the power sensor 38c.

The operation unit 150B outputs the calculated load impedance ZL2 to a matching controller 152B. The matching controller 152B adjusts the reactance of the variable reactance elements 42g and 42h by controlling the actuators 42d and 42e such that the load impedance ZL2 approximates to the output impedance of the high frequency power supply 38 (or the matching point). Accordingly, the impedance matching by the matching device 42 is achieved. Further, the matching controller 152B may control the actuators 42d and 42e such that a moving average value of series of the load impedance ZL2 output by the operation unit 150B approximates to the output impedance of the high frequency power supply 38 (or the matching point).

Further, in case that the high frequency power RF2 is supplied to the susceptor 16 and the power level of the high frequency power RF1 is set to be low in the preceding stage, the operation unit 150B determines whether the calculated second parameter exceeds a corresponding threshold value Th2(j) from when the processing gas supplied from the gas supply system 55 is changed for the succeeding stage S(j). Initially, the threshold value Th2(j) is set as a preset value indicating that the processing gas within the processing vessel 10 is switched. If the second parameter exceeds the threshold value Th2(j), the operation unit 150B applies signals to the power supply controller 38e, the power supply controller 36e and the DC power supply 74. In case that the second high frequency power setting signal is applied from the main controller 72, the power supply controller 38e changes the setting of the high frequency power RF2 according to the second high frequency power setting signal in response to the signal from the operation unit 150B. That is, in case that the second high frequency power setting signal is applied from the main controller 72, the high frequency power supply 38 changes the setting of the high frequency power RF2 (e.g., decreases the power level of the high frequency power RF2) according to the second high frequency power setting signal at a time point when the second parameter exceeds the threshold value Th2(j).

Furthermore, in case that the first high frequency power setting signal is applied from the main controller 72, the power supply controller 36e of the high frequency power supply 36 changes the setting of the high frequency power RF1 according to the first high frequency power setting signal in response to the signal from the operation unit 150B. That is, in case that the first high frequency power setting signal is applied from the main controller 72, the high frequency power supply 36 changes the setting of the high frequency power RF1 (e.g., increases the power level of the high frequency power RF1) according to the first high frequency power setting signal at the time point when the second parameter exceeds the threshold value Th2(j).

Further, in case that the DC voltage setting signal is applied from the main controller 72 in the stage S(j), the DC power supply 74 changes the level of the DC voltage DC to a level designated by the DC voltage setting signal in response to the signal from the operation unit 150B. That is, in case that the DC voltage setting signal is sent from the main controller 72 in the stage S(j), the DC power supply 74 changes the level of the DC voltage DC to the level designated by the DC voltage setting signal at the time point when the second parameter exceeds the threshold value Th2(j).

Furthermore, the operation unit 150B sends, to the time adjusting unit 80, third information which specifies the time point when the second parameter exceeds the threshold value Th2(j) in the stage S(j). The time adjusting unit 80 also receives, from the main controller 72, fourth information specifying a time point when transitioning to the stage S(i, j), i.e., the start time point Ts(i, j). The time adjusting unit 80 calculates a second time difference between the time point specified by the third information and the time point specified by the fourth information. Then, the time adjusting unit 80 sends, to the main controller 72, second time difference specifying information which specifies this second time difference. The main controller 72 adjusts the stage S(j) of the subsequent cycle CY to be increased from a preset processing time of the stage S(j) designated in the recipe by the second time difference specified by the second time difference specifying information.

Figure 9:
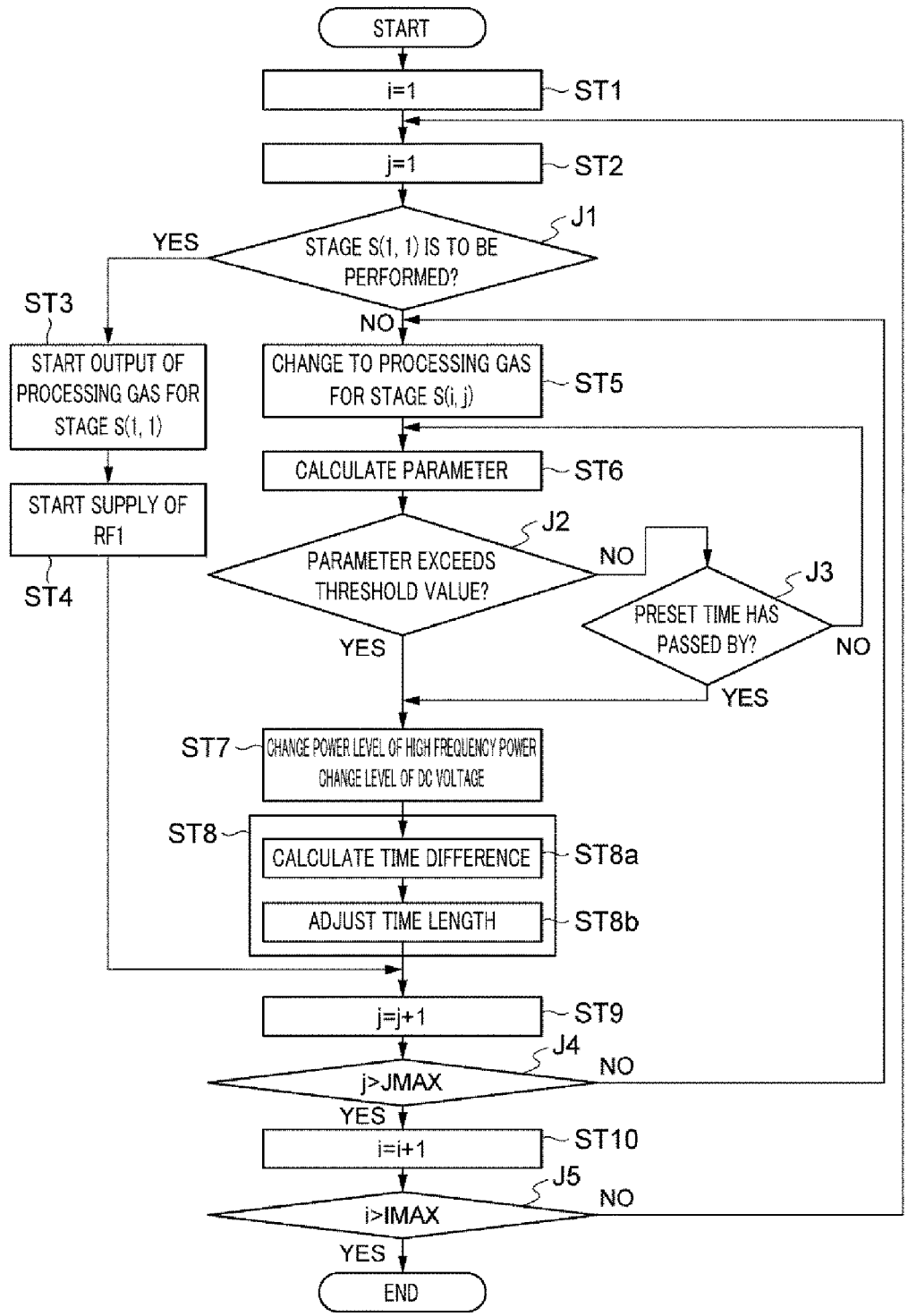
FIG. 9 is a flowchart for describing the plasma processing method according to the exemplary embodiment.

Now, referring to FIG. 9, the method MT will be elaborated in detail. FIG. 9 is a flowchart for describing the plasma processing method according to the exemplary embodiment. In the method MT, a process ST1 is first performed. In the process ST1, "i" is set to be 1 by the main controller 72. Here, "i" is the variable which specifies the operation order of each of the multiple cycles, as stated above. In a subsequent process ST2, "j" is set to be 1 by the main controller 72. Here, "j" is the variable which specifies the operation order of each of the plural stages S in each cycle CY, as mentioned above.

In a subsequent process J1, it is determined whether the first stage of the first cycle is to be performed. That is, it is determined by the main controller 72 whether to perform the stage S(1, 1). In case of performing the stage S(1, 1), in a subsequent process ST3, the main controller 72 controls the gas supply system 55 to start the output of the processing gas for the stage S(1, 1) designated in the recipe. In the examples shown in FIG. 2 to FIG. 4, in a next process ST4, the high frequency power supply 36 starts supplying the high frequency power RF1 having the setting designated by the first high frequency power setting signal from the main controller 72. Thereafter, the processing proceeds to a process ST9.

Meanwhile, if it is determined in the process J1 that a stage S(i, j) other than the stage S(1, 1) is to be performed, the gas supply system 55 is controlled by the main controller 72 in a process ST5 such that the processing gas output from the gas supply system 55 is changed to the processing gas for the stage S(i, j) designated in the recipe. Further, the changeover of the processing gas of the gas supply system 55 in the process ST5 is performed when transitioning to the stage S(i, j), that is, at the start time point Ts(i, j) of the stage S(i, j).

In case that the high frequency power RF1 is supplied to the susceptor 16 and the power level of the high frequency power RF2 is set to be low in the preceding stage such as a stage S(i, 1) in the examples of FIG. 2 to FIG. 4, the aforementioned first parameter is calculated by the operation unit 150A in a subsequent process ST6. The calculation of the first parameter by the operation unit 150A is begun from the time point when the processing gas output from the gas supply system 55 is changed in the process ST5. In a subsequent process J2, it is determined by the operation unit 150A whether the first parameter exceeds the threshold value Th1(j). If it is determined in the process J2 that the first parameter exceeds the threshold value Th1(j), the processing proceeds to a process ST7. Meanwhile, if it is determined that the first parameter does not exceed the threshold value Th1(j), it is determined by the operation unit 150A in a process J3 whether a preset time has elapsed from the start time point of the stage S(i, j). If it is determined in the process J3 that the preset time has not passed by from the start time point of the stage S(i, j), the process ST6 is performed again. Meanwhile, if it is determined in the process J3 that the preset time has elapsed from the start time point of the stage S(i, j), the processing advances to the process ST7. Through the process J3, it can be avoided that the processing does not proceed to the process ST7.

In the process ST7, to notify that the first parameter exceeds the threshold value Th1(j), the aforementioned signals are applied to the power supply controller 36e of the high frequency power supply 36, the power supply controller 38e of the high frequency power supply 38 and the DC power supply 74 by the operation unit 150A. In case that the first high frequency power setting signal is applied to the high frequency power supply 36 from the main controller 72 for the stage S(i, j), the high frequency power supply 36 changes the setting of the high frequency power RF1 to the setting designated by the first high frequency power setting signal (for example, decreases the power level of the high frequency power RF1). Further, in case that the second high frequency power setting signal is applied to the high frequency power supply 38 from the main controller 72 for the stage S(i, j), the high frequency power supply 38 changes the setting of the high frequency power RF2 to the setting designated by the second high frequency power setting signal (for example, increases the power level of the high frequency power RF2). Further, in case that the DC voltage setting signal is applied to the DC power supply 74 form the main controller 72 for the stage S(i, j), the DC power supply 74 changes the level of the DC voltage DC to the level designated by the DC voltage setting signal.

Subsequently, in the method MT, a process ST8 is performed. The process ST8 includes a process ST8a and a process ST8b. In the process ST8a, the aforementioned first time difference is calculated. To elaborate, the first information specifying the time point when the first parameter exceeds the threshold value Th1(j) in the stage S(i, j) is applied to the time adjusting unit 80 from the operation unit 150A, and the second information specifying the time point when transitioning to the stage S(i, j), i.e., the start time point Ts(i, j) is also applied to the time adjusting unit 80 from the main controller 72. In the process ST8a, the time adjusting unit 80 calculates the first time difference between the time point specified by the first information and the time point specified by the second information. Then, the time adjusting unit 80 applies the first time difference specifying information which specifies the corresponding first time difference to the main controller 72. In the subsequent process ST8b, the main controller 72 adjusts the length of the processing time of the stage S(j) of the subsequent cycle CY, e.g., the stage S(i+1, j) such that the processing time of the stage S(i+1, j) is increased from the processing time of the stage S(j) designated in the recipe by the time difference specified in the first time difference specifying information.

In case that the high frequency power RF2 is supplied to the susceptor 16 and the power level of the high frequency power RF1 is set to be low in the preceding stage such as a stage S(i, 2) in the examples of FIG. 2 to FIG. 4, the aforementioned second parameter is calculated by the operation unit 150b in the process ST6. The calculation of the second parameter by the operation unit 150b is begun from the time point when the processing gas output from the gas supply system 55 is changed in the process ST5. In the subsequent process J2, it is determined by the operation unit 150b whether the second parameter exceeds the threshold value Th2(j). If it is determined in the process J2 that the second parameter exceeds the threshold value Th2(j), the processing proceeds to the process ST7. Meanwhile, if it is determined that the second parameter does not exceed the threshold value Th2(j), it is determined by the operation unit 150b in the process J3 whether a preset time has elapsed from the start time point of the stage S(i, j). If it is determined in the process J3 that the preset time has not passed by from the start time point of the stage S(i, j), the process ST6 is performed again. Meanwhile, if it is determined in the process J3 that the preset time has elapsed from the start time point of the stage S(i, j), the processing advances to the process ST7.

In the process ST7, to notify that the second parameter exceeds the threshold value Th2(j), the aforementioned signals are applied to the power supply controller 38e of the high frequency power supply 38, the power supply controller 36e of the high frequency power supply 36 and the DC power supply 74 by the operation unit 150b. In case that the second high frequency power setting signal is applied to the high frequency power supply 38 from the main controller 72 for the stage S(i, j), the high frequency power supply 38 changes the setting of the high frequency power RF2 to the setting designated by the second high frequency power setting signal (for example, decreases the power level of the high frequency power RF2). Further, in case that the first high frequency power setting signal is applied to the high frequency power supply 36 from the main controller 72 for the stage S(i, j), the high frequency power supply 36 changes the setting of the high frequency power RF1 to the setting designated by the first high frequency power setting signal (for example, increases the power level of the high frequency power RF1). Further, in case that the DC voltage setting signal is applied to the DC power supply 74 form the main controller 72 for the stage S(i, j), the DC power supply 74 changes the level of the DC voltage DC to the level designated by the DC voltage setting signal.

Subsequently, in the method MT, the process ST8 is performed. In the process ST8a, the aforementioned second time difference is calculated. To elaborate, the third information specifying the time point when the second parameter exceeds the threshold value Th2(j) in the stage S(i, j) is applied to the time adjusting unit 80 from the operation unit 150A, and the fourth information specifying the time point when transitioning to the stage S(i, j), i.e., the start time point Ts(i, j) is also applied to the time adjusting unit 80 from the main controller 72. In the process ST8a, the time adjusting unit 80 calculates the second time difference between the time point specified by the third information and the time point specified by the fourth information. Then, the time adjusting unit 80 applies the second time difference specifying information which specifies the corresponding second time difference to the main controller 72. In the subsequent process ST8b, the main controller 72 adjusts the length of the processing time of the stage S(j) of the subsequent cycle CY, e.g., the stage S(i+1, j) such that the processing time of the stage S(i+1, j) is increased from the processing time of the stage S(j) designated in the recipe by the time difference specified in the second time difference specifying information.

In the method MT, a subsequent process ST9 is conducted. In the process ST9, j is increased by an increment of 1 by the main controller 72. In a following process J4, it is determined whether j is larger than JMAX. If J is equal to or smaller than JMAX, the processing proceeds to the process ST5. Meanwhile, if j is larger than JMAX, i is increased by an increment of 1 by the main controller 72 in a subsequent process ST10. Then, in a process J5, it is determined whether i is larger than IMAX. If i is equal to or smaller than IMAX, the processing proceeds to the process ST2. Meanwhile, if i is larger than IMAX, the method MT is ended.

If the processing gas within the processing vessel is changed while the supply of the high frequency power RF1 is continued, the impedance of plasma generated within the processing vessel 10 is changed. Since the aforementioned first parameter varies depending on the impedance of the plasma, the first parameter well reflects the variation in the processing gas which exists within the processing vessel 10. In the method MT, by detecting the time point when this first parameter exceeds the threshold value Th1(j), the time point TP(j) when the processing gas within the processing vessel 10 is changed can be detected accurately. Furthermore, since the power level of the high frequency power RF2 is increased at this time point TP(j), it is possible to increase the power level of the high frequency power RF2 at an appropriate time point when the processing gas within the processing vessel is changed.

If the processing gas within the processing vessel 10 is changed while the supply of the high frequency power RF2 is continued, the impedance of plasma generated within the processing vessel 10 is changed. Since the aforementioned second parameter varies depending on the impedance of the plasma, the second parameter well reflects the variation in the processing gas which exists within the processing vessel 10. In the method MT, by detecting the time point when this second parameter exceeds the threshold value Th2(j), the time point TP(j) when the processing gas within the processing vessel 10 is changed can be detected accurately. Furthermore, since the power level of the high frequency power RF1 is increased at this time point TP(j), it is possible to increase the power level of the high frequency power RF1 at an appropriate time point when the processing gas within the processing vessel is changed.

Further, the length of the processing time of each of the plural stages S is initially set. Accordingly, if the time point when the first parameter exceeds the threshold value Th1(j) at the stage S(i, j) is delayed, the time length of the plasma processing from this time point TP(j) within the processing time of the stage S(i, j) is shortened. According to this exemplary embodiment, since the time length of the stage S(j) in the subsequent cycle CY is increased by the first time difference, the length of the total processing time of the plasma processing at the same stages in the multiple cycles CY can be maintained substantially same. Likewise, for the stage S(j) in which the time point TP(j) is calculated by using the second parameter, the length of the total processing time of the plasma processing at the same stages in the multiple cycles CY can be maintained substantially same.

Figure 10:
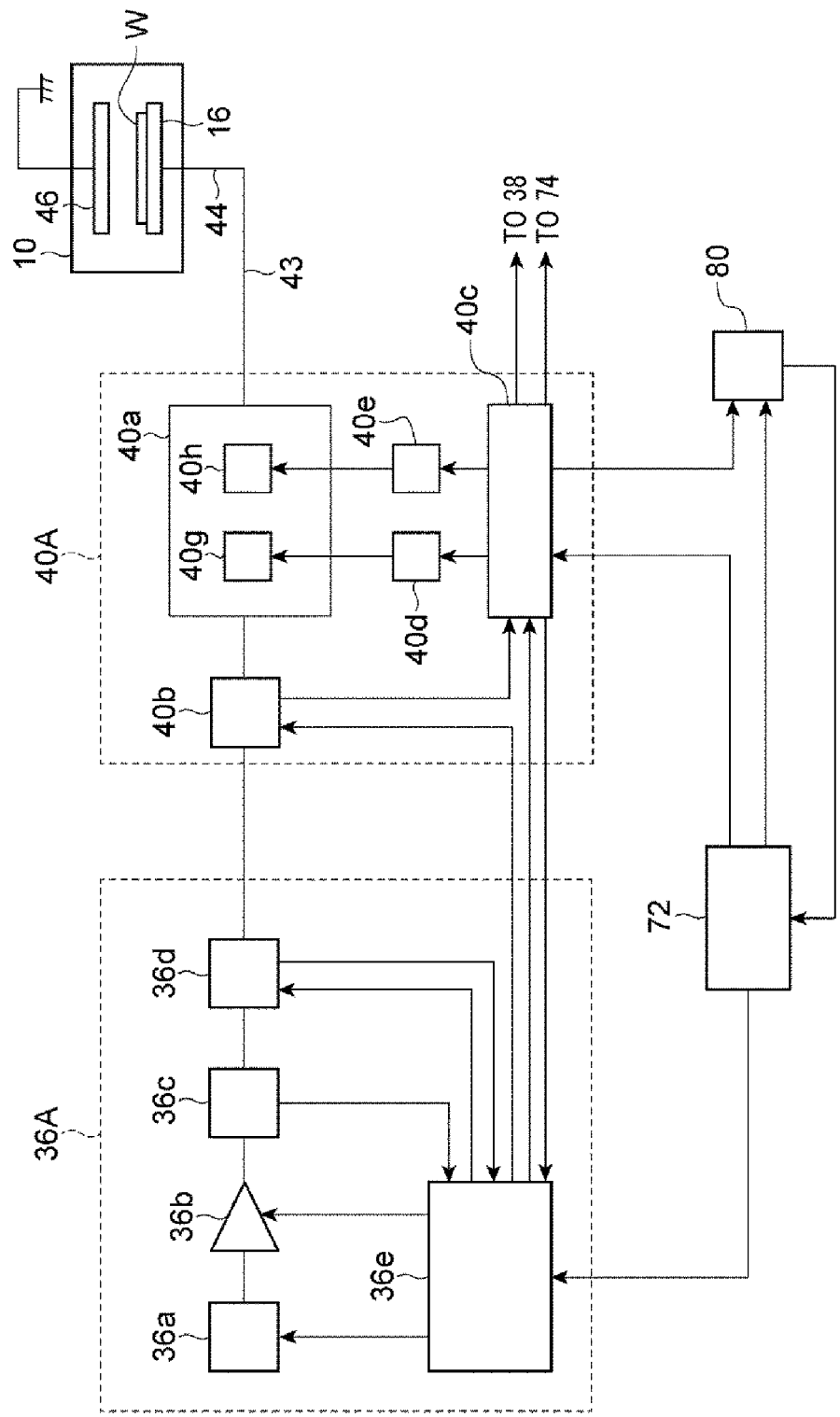
FIG. 10 is a diagram illustrating another example configuration of a first high frequency power supply and a first matching device.

Now, another exemplary embodiment will be explained. In a method MT according to this exemplary embodiment, the frequency of the high frequency power RF1 is adjusted in the stage, among the plural stages S, where the high frequency power RF1 is supplied to the susceptor 16. Further, in the stage, among the plural stages S, where the high frequency power RF2 is supplied to the susceptor 16, the frequency of the high frequency power RF2 is adjusted. In still another exemplary embodiment, the power level of the high frequency power RF1 supplied to the susceptor 16 is adjusted. Further, the power level of the high frequency power RF2 supplied to the susceptor 16 is also adjusted. In the following, referring to FIG. 10 to FIG. 13, a high frequency power supply 36A, a matching device 40A, a high frequency power supply 38A and a matching device 42A employed in the plasma processing apparatus 1 instead of the high frequency power supply 36, the matching device 40, the high frequency power supply 38 and the matching device 42, respectively, will be discussed in order to perform the method MT according to the exemplary embodiments. FIG. 10 is a diagram illustrating a configuration of the high frequency power supply 36A and the matching device 40A.

Figure 11:
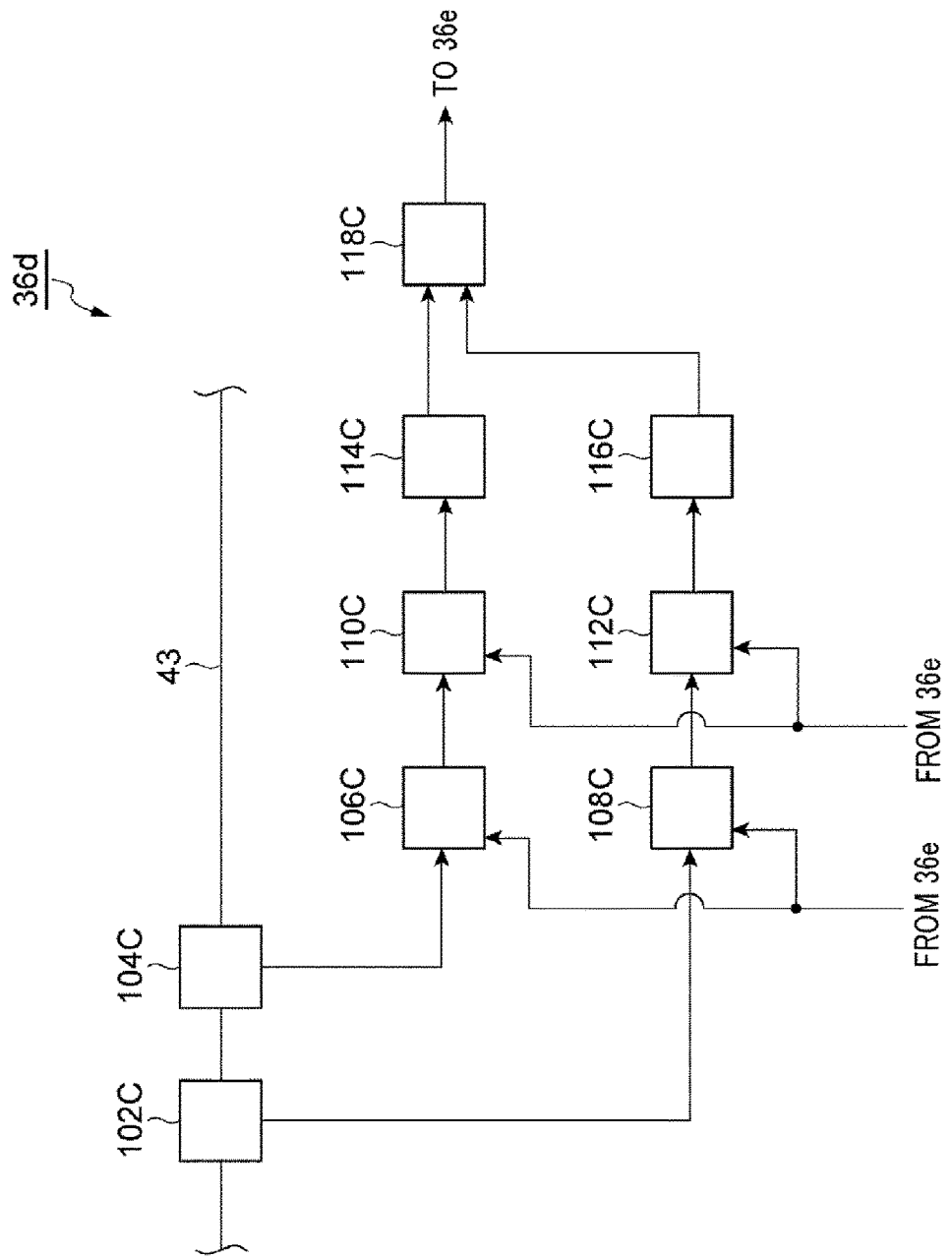
FIG. 11 is a diagram illustrating a configuration of an impedance sensor of the first high frequency power supply.
Figure 12:
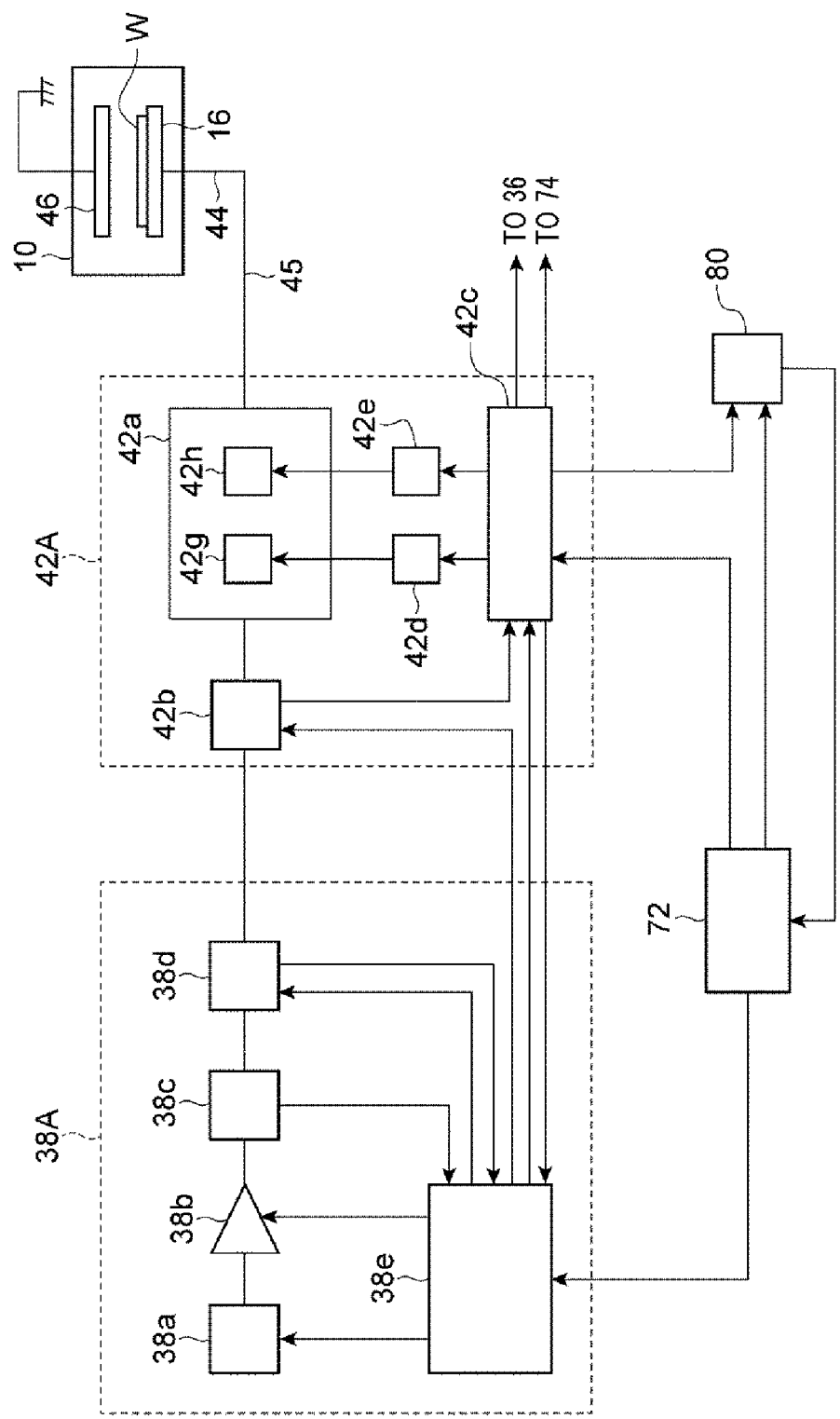
FIG. 12 is a diagram illustrating another example configuration of a second high frequency power supply and a second matching device.
Figure 13:
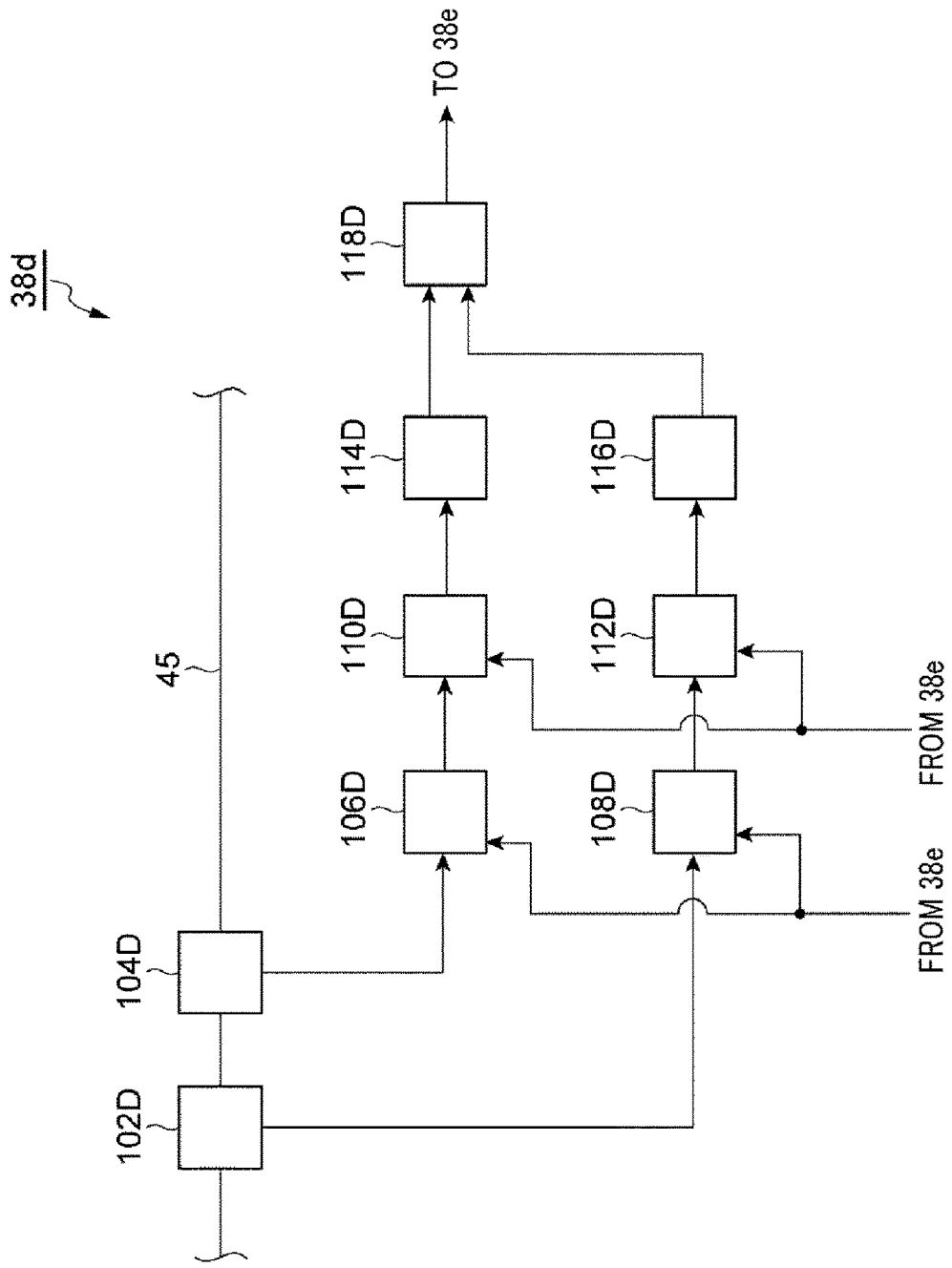
FIG. 13 is a diagram illustrating a configuration of an impedance sensor of the second high frequency power supply.

FIG. 11 is a diagram illustrating a configuration of an impedance sensor of the high frequency power supply 36A. FIG. 12 is a diagram illustrating a configuration of the high frequency power supply 38A and the matching device 42A. FIG. 13 is a diagram illustrating a configuration of an impedance sensor of the high frequency power supply 38A.

As depicted in FIG. 10, the high frequency power supply 36A includes, like the high frequency power supply 36, an oscillator 36a, a power amplifier 36b, a power sensor 36c and a power supply controller 36e. The high frequency power supply 36A further includes an impedance sensor 36d. Below, regarding the individual components of the high frequency power supply 36A, distinctive features from the corresponding components of the high frequency power supply 36 will be described. Further, the impedance sensor 36d will also be explained.

The power supply controller 36e of the high frequency power supply 36A is configured to output, to the oscillator 36a, a frequency control signal for setting the frequency of the high frequency power RF1 in each of a first sub-period Ps1(j) and a second sub-period Ps2(j) within a processing time of a stage S(i, j), such as the stage S(i, 3) shown in FIG. 2, in which the high frequency power RF1 is supplied to the susceptor 16. To elaborate, the power supply controller 36e receives, from the impedance sensor 36d, a moving average value Imp11 of a load impedance of the high frequency power supply 36A in a first sub-period Ps1(j) within a processing time of a past stage S(j) specified by the same value of "j" as in the stage S(i, j) and a moving average value Imp12 of the load impedance of the high frequency power supply 36A in a second sub-period Ps2(j) within the processing time of the corresponding past stage S(j).

If the moving average value Imp11 and the moving average value Imp12 are within a preset control range, the power supply controller 36e sends, to the oscillator 36a, the frequency control signal for setting the frequency of the high frequency power RF1 for each of the first sub-period Ps1(j) and the second sub-period Ps2(j) within the processing time of the stage S(i, j) in order to allow the load impedance of the high frequency power supply 36A in the first sub-period Ps1(j) estimated from the moving average value Imp11 and the load impedance of the high frequency power supply 36A in the second sub-period Ps2(j) estimated from the moving average value Imp12 to approximate to the matching point. The oscillator 36a sets the frequency of the high frequency power RF1 for the first sub-period Ps1(j) and the frequency of the high frequency power RF1 for the second sub-period Ps2(j) within the processing time of the stage S(i, j) according to the corresponding frequency control signal.

Meanwhile, if the moving average value Imp11 or the moving average value Imp12 does not fall within the preset control range, the power supply controller 36e sends, to the matching device 40A, a control signal in order to allow the matching device 40A to perform the impedance matching of the high frequency power supply 36A. Here, the allowing of the load impedance to approximate to the matching point ideally implies making the load impedance coincident with the matching point. Further, the "preset control range" refers to a range in which the load impedance of the high frequency power supply 36A can be matched with the matching point or the output impedance of the high frequency power supply 36A through the control of the frequency of the high frequency power RF1.

The power amplifier 36b generates the high frequency power RF1 by amplifying the high frequency power output from the oscillator 36a, and then, outputs the corresponding high frequency power RF1. This power amplifier 36b is controlled by the power supply controller 36e. To be specific, the power supply controller 36e controls the power amplifier 36b to output the high frequency power RF1 having a power level designated by the main controller 72.

In the present exemplary embodiment, the power supply controller 36e may control the power amplifier 36b such that the power level of the high frequency power RF1 in the first sub-period Ps1(j) is higher than that of the high frequency power RF1 in the second sub-period Ps2(j). By way of example, the power level of the high frequency power RF1 in the first sub-period Ps1(j) of the stage S(i, j) may be set, based on the reflection wave power measurement value PR11 in the first sub-period Ps1(j) of the stage S(i, j) or the moving average value of the reflection wave power measurement value PR11 in the first sub-period Ps1(j) within the processing time of the past stage S(j) specified by the same value of "j" as in the stage S(i, j), such that the power level of the high frequency power RF1 combined to the plasma reaches a preset power level. Further, the power level of the high frequency power RF1 in the second sub-period Ps2(j) of the stage S(i, j) may be set, based on the reflection wave power measurement value PR11 in the second sub-period Ps2(j) of the stage S(i, j) or the moving average value of the reflection wave power measurement value PR11 in the second sub-period Ps2(j) within the processing time of the past stage S(j) specified by the same value of "j" as in the stage S(i, j), such that the power level of the high frequency power RF1 combined to the plasma reaches a preset power level.

The impedance sensor 36d calculates the moving average value Imp11 of the load impedance of the high frequency power supply 36A in the first sub-periods Ps1(j) within the processing times of the stages S(j) specified by the same value of "j" as in the stage S(i, j) among the plural stages of the completed cycles CY. Further, the impedance sensor 36d also calculates the moving average value Imp12 of the load impedance of the high frequency power supply 36A in the second sub-periods Ps2(j) within the processing times of the stages S(j) specified by the same value of "j" as in the stage S(i, j) among the plural stages of the completed cycles CY. As depicted in FIG. 2, within the processing time of each stage S(i, j), the first sub-period Ps1(j) in the stage S(i, j) in which the high frequency power RF1 is supplied to the susceptor 16 (e.g., the stage S(i, 3)) is a period ranging from a time point when the setting of the high frequency power RF1 is changed to a certain time point within the corresponding processing time. Further, within the processing time of the corresponding stage S(i, j), the second sub-period Ps2(j) is a period ranging from the aforementioned certain time point to an end time point of the corresponding processing time.

A time length of the first sub-period Ps1(j) and a time length of the second sub-period Ps2(j) in the stage S(i, j) where the high frequency power RF1 is supplied to the susceptor 16 are set by the power supply controller 36e. By way of example, the time length of the first sub-period Ps1(j) may be a preset time length stored in the power supply controller 36e, and the time length of the second sub-period Ps2(j) may be another predetermined time length stored in the power supply controller 36e. Alternatively, based on time series of the aforementioned reflection wave power measurement value PR11, the power supply controller 36e may set, as the second sub-period Ps2(j), a period in which the reflection wave power measurement value PR11 is stabilized equal to or below a preset value within the processing time of the stage S(i, j). In such a case, a period prior to this second sub-period Ps2(j) within the processing time of the stage S(i, j) may be set as the first sub-period Ps1(j).

As illustrated in FIG. 11, the impedance sensor 36d includes a current detector 102C, a voltage detector 104C, a filter 106C, a filter 108C, an average value calculator 110C, an average value calculator 112C, a moving average value calculator 114C, a moving average value calculator 116C and an impedance calculator 118C.

The voltage detector 104C is configured to detect a voltage waveform of the high frequency power RF1 transmitted on the power feed line 43 and is configured to output a voltage waveform analog signal indicating the corresponding voltage waveform. This voltage waveform analog signal is input to the filter 106C. The filter 106C is configured to generate a voltage waveform digital signal by digitizing the voltage waveform analog signal input thereto. Further, the filter 106C receives, from the power supply controller 36e, the signal specifying the frequency of the high frequency power RF1 for each of the first sub-period Ps1(j) and the second sub-period Ps2(j), and then, generates a filtered voltage waveform signal by extracting, from the voltage waveform digital signal, only a component corresponding to the frequency specified by this signal. Further, the filter 106C may be composed of, by way of non-limiting example, a FPGA (Field Programmable Gate Array).

The filtered voltage waveform signal generated by the filter 106C is output to the average value calculator 110C. The average value calculator 110C receives, from the power supply controller 36e, a sub-period specifying signal specifying the first sub-period Ps1(j) and the second sub-period Ps2(j). The average value calculator 110C calculates, from the filtered voltage waveform signal, an average value VA11 of the voltages in the first sub-period Ps1(j) within the processing time of the stage S(i, j) specified by using the sub-period specifying signal. Further, the average value calculator 110C also calculates, from the filtered voltage waveform signal, an average value VA12 of the voltages in the second sub-period Ps2(j) within the processing time of the stage S(i, j) specified by using the sub-period specifying signal. Furthermore, the average value calculator 110C may be composed of, by way of non-limiting example, a FPGA (Field Programmable Gate Array).

The average value VA11 and the average value VA12 obtained by the average value calculator 110C are output to the moving average value calculator 114C. The moving average value calculator 114C calculates a moving average value (moving average value VMA11) of a preset number of average values VA11 which are obtained in the first sub-periods Ps1(j) of the present number of recently performed stages S(j) among a multiple number of average values VA11 previously obtained for the stages S(j) specified by the same value of "j" as in the stage S(i, j) among the plural stages belonging to the completed cycles CY. Further, the moving average value calculator 114C also calculates a moving average value (moving average value VMA12) of the preset number of average values VA12 which are obtained for the second sub-periods Ps2(j) of the present number of recently performed stages S(j) among the multiple number of average values VA12 previously obtained for the stages S(j) specified by the same value of "j" as in the stage S(i, j) among the plural stages belonging to the completed cycles CY. The moving average values VMA11 and VMA12 obtained by the moving average value calculator 114C are output to the impedance sensor 118C. Further, the moving average value calculator 114C may be implemented by, by way of non-limiting example, a CPU or a FPGA (Field Programmable Gate Array).

The current detector 102C is configured to detect a current waveform of the high frequency power RF1 transmitted on the power feed line 43 and is configured to output a current waveform analog signal indicating the corresponding current waveform. This current waveform analog signal is input to the filter 108C. Further, the filter 108C is configured to generate a current waveform digital signal by digitizing the current waveform analog signal input thereto. Further, the filter 108C receives, from the power supply controller 36e, the signal specifying the frequency of the high frequency power RF1 for each of the first sub-period Ps1(j) and the second sub-period Ps2(j), and then, generates a filtered current waveform signal by extracting, from the current waveform digital signal, only a component corresponding to the frequency specified by this signal. Further, the filter 108C may be composed of, by way of non-limiting example, a FPGA (Field Programmable Gate Array).

The filtered current waveform signal generated by the filter 108C is output to the average value calculator 112C. The average value calculator 112C receives the aforementioned sub-period specifying signal from the power supply controller 36e. The average value calculator 112C calculates, from the filtered current waveform signal, an average value IA11 of the electric currents in the first sub-period Ps1(j) within the processing time of the stage S(i, j) specified by using the sub-period specifying signal. Further, the average value calculator 112C also calculates, from the filtered current waveform signal, an average value IA12 of the electric currents in the second sub-period Ps2(j) within the processing time of the stage S(i, j) specified by using the sub-period specifying signal. Furthermore, the average value calculator 112C may be composed of, by way of non-limiting example, a FPGA (Field Programmable Gate Array).

The average value IA11 and the average value IA12 obtained by the average value calculator 112C are output to the moving average value calculator 116C. The moving average value calculator 116C calculates a moving average value (moving average value IMA11) of the preset number of average values IA11 which are obtained in the first sub-periods Ps1(j) of the present number of recently performed stages S(j) among the multiple number of average values IA11 previously obtained for the stages S(j) specified by the same value of "j" as in the stage S(i, j) among the plural stages belonging to the completed cycles CY. Further, the moving average value calculator 116C also calculates a moving average value (moving average value IMA12) of the preset number of average values IA12 which are obtained in the second sub-periods Ps2(j) of the present number of recently performed stages S(j) among the multiple number of average values IA12 previously obtained for the stages S(j) specified by the same value of "j" as in the stage S(i, j) among the plural stages belonging to the completed cycles CY. The moving average values IMA11 and IMA12 obtained by the moving average value calculator 116C are output to the impedance sensor 118C. Further, the moving average value calculator 116C may be composed of, by way of non-limiting example, a CPU or a FPGA (Field Programmable Gate Array).

The impedance calculator 118C calculates the moving average value Imp11 of the load impedance of the high frequency power supply 36A from the moving average value IMA11 and the moving average value VMA11. This moving average value Imp11 includes an absolute value and a phase component. Further, the impedance calculator 118C also calculates the moving average value Imp12 of the load impedance of the high frequency power supply 36A from the moving average value IMA12 and the moving average value VMA12. This moving average value Imp12 includes an absolute value and a phase component. The moving average values Imp11 and Imp12 obtained by the impedance calculator 118C are output to the power supply controller 36e. The moving average values Imp11 and Imp12 are used to set the frequency of the high frequency power RF1 in the power supply controller 36e, as stated above.

Referring back to FIG. 10, the matching device 40A includes, like the matching device 40, a matching circuit 40a, a sensor 40b, a controller 40c and actuators 40d and 40e. Below, regarding the individual components of the matching device 40A, distinctive features from the corresponding components of the matching device 40 will be discussed.

Like the impedance sensor 36d, the sensor 40b of the matching device 40A receives, from the power supply controller 36e, the signal specifying the frequency of the high frequency power RF1 for each of the first sub-period Ps1(j) and the second sub-period Ps2(j), and then, generates a filtered voltage waveform signal by extracting, from the voltage waveform digital signal, only the component corresponding to the frequency specified by this signal. Further, the sensor 40b outputs the filtered voltage waveform signal to the controller 40c. Furthermore, like the impedance sensor 36d, the sensor 40b of the matching device 40A receives, from the power supply controller 36e, the signal specifying the frequency of the high frequency power RF1 for each of the first sub-period Ps1(j) and the second sub-period Ps2(j), and then, generates a filtered current waveform signal by extracting, from the current waveform digital signal, only the component corresponding to the frequency specified by this signal. The sensor 40b outputs this filtered current waveform signal to the controller 40c.

If the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by an average value of the moving average value Imp11 and the moving average value Imp12 approximates to the matching point. Alternatively, if the moving average value Imp11 or the moving average value Imp12 does not fall within the preset control range, in response to the aforementioned control signal which is sent from the power supply controller 36e, the controller 40c of the matching device 40A controls the actuators 40d and 40e such that the load impedance of the high frequency power supply 36A specified by the moving average value Imp12 approximates to the matching point.

Now, reference is made to FIG. 12. As depicted in FIG. 12, the high frequency power supply 38A includes, like the high frequency power supply 38, an oscillator 38a, a power amplifier 38b, a power sensor 38c and a power supply controller 38e. The high frequency power supply 38A further includes an impedance sensor 38d. Below, regarding the individual components of the high frequency power supply 38A, distinctive features from the corresponding components of the high frequency power supply 38 will be described. Further, the impedance sensor 38d will also be explained.

The power supply controller 38e of the high frequency power supply 38A is configured to output, to the oscillator 38a, a frequency control signal for setting the frequency of the high frequency power RF2 in each of a first sub-period Ps1($j$) and a second sub-period Ps2($j$) within a processing time of a stage S(i, j), such as the stage S(i, 2) shown in FIG. 2, in which the high frequency power RF2 is supplied to the susceptor 16. To elaborate, the power supply controller 38$e$ receives, from the impedance sensor 38$d$, a moving average value Imp21 of a load impedance of the high frequency power supply 38A in a first sub-period Ps1($j$) within a processing time of a past stage S(j) specified by the same value of "j" as in the stage S(i, j) and a moving average value Imp22 of the load impedance of the high frequency power supply 38A in a second sub-period Ps2($j$) within the processing time of the corresponding past stage S(j).

If the moving average value Imp21 and the moving average value Imp22 are within a preset control range, the power supply controller 38$e$ sends, to the oscillator 38$a$, the frequency control signal for setting the frequency of the high frequency power RF2 for each of the first sub-period Ps1($j$) and the second sub-period Ps2($j$) within the processing time of the stage S(i, j) in order to allow the load impedance of the high frequency power supply 38A in the first sub-period Ps1($j$) estimated from the moving average value Imp21 and the load impedance of the high frequency power supply 38A in the second sub-period Ps2($j$) estimated from the moving average value Imp22 to approximate to the matching point. The oscillator 38$a$ sets the frequency of the high frequency power RF2 for the first sub-period Ps1($j$) and the frequency of the high frequency power RF2 for the second sub-period Ps2($j$) within the processing time of the stage S(i, j) according to the corresponding frequency control signal.

Meanwhile, if the moving average value Imp21 or the moving average value Imp22 does not fall within the preset control range, the power supply controller 38$e$ sends, to the matching device 42A, a control signal in order to allow the matching device 42A to perform the impedance matching of the high frequency power supply 38A. Here, the "preset control range" refers to a range in which the load impedance of the high frequency power supply 38A can be matched with the matching point or the output impedance of the high frequency power supply 38A through the control of the frequency of the high frequency power RF2.

The power amplifier 38$b$ generates the high frequency power RF2 by amplifying the high frequency power output from the oscillator 38$a$, and then, outputs the corresponding high frequency power RF2. This power amplifier 38$b$ is controlled by the power supply controller 38$e$. To be specific, the power supply controller 38$e$ controls the power amplifier 38$b$ to output the high frequency power RF2 having a power level designated by the main controller 72.

In the present exemplary embodiment, the power supply controller 38$e$ may control the power amplifier 38$b$ such that the power level of the high frequency power RF2 in the first sub-period Ps1($j$) is higher than that of the high frequency power RF2 in the second sub-period Ps2($j$). By way of example, the power level of the high frequency power RF2 in the first sub-period Ps1($j$) of the stage S(i, j) may be set, based on the reflection wave power measurement value PR21 in the first sub-period Ps1($j$) of the stage S(i, j) or the moving average value of the reflection wave power measurement value PR21 in the first sub-period Ps1($j$) within the processing time of the past stage S(j) specified by the same value of "j" as in the stage S(i, j), such that the power level of the high frequency power RF2 combined to the plasma reaches a preset power level. Further, the power level of the high frequency power RF2 in the second sub-period Ps2($j$) of the stage S(i, j) may be set, based on the reflection wave power measurement value PR21 in the second sub-period Ps2($j$) of the stage S(i, j) or the moving average value of the reflection wave power measurement value PR21 in the second sub-period Ps2($j$) within the processing time of the past stage S(j) specified by the same value of "j" as in the stage S(i, j), such that the power level of the high frequency power RF2 combined to the plasma reaches a preset power level.

The impedance sensor 38$d$ calculates the moving average value Imp22 of the load impedance of the high frequency power supply 38A in first sub-periods Ps1($j$) within the processing times of the stages S(j) specified by the same value of "j" as in the stage S(i, j) among the plural stages of the completed cycles CY. Further, the impedance sensor 38$d$ also calculates the moving average value Imp22 of the load impedance of the high frequency power supply 38A in second sub-periods Ps2($j$) within the processing times of the stages S(j) specified by the same value of "j" as in the stage S(i, j) among the plural stages of the completed cycles CY. As depicted in FIG. 2, within the processing time of each stage S(i, j), the first sub-period Ps1($j$) of the stage S(i, j) (e.g., the stage S(i, 2)) in which the high frequency power RF2 is supplied to the susceptor 16 is a period ranging from a time point when the setting of the high frequency power RF2 is changed to a certain time point within the corresponding processing time. Further, within each processing time of the stage S(i, j), the second sub-period Ps2($j$) is a period ranging from the aforementioned certain time point to an end time point of the corresponding processing time.

A time length of the first sub-period Ps1($j$) and a time length of the second sub-period Ps2($j$) in the stage S(i, j) where the high frequency power RF2 is supplied to the susceptor 16 are set by the power supply controller 38$e$. By way of example, the time length of the first sub-period Ps1($j$) may be a preset time length stored in the power supply controller 38$e$, and the time length of the second sub-period Ps2($j$) may be another predetermined time length stored in the power supply controller 38$e$. Alternatively, based on time series of the aforementioned reflection wave power measurement value PR21, the power supply controller 38$e$ may set, as the second sub-period Ps2($j$), a period in which the reflection wave power measurement value PR21 is stabilized equal to or below a preset value within the processing time of the stage S(i, j). In such a case, a period prior to this second sub-period Ps2($j$) within the processing time of the stage S(i, j) may be set as the first sub-period Ps1($j$).

As illustrated in FIG. 13, the impedance sensor 38$d$ includes a current detector 102D, a voltage detector 104D, a filter 106D, a filter 108D, an average value calculator 110D, an average value calculator 112D, a moving average value calculator 114D, a moving average value calculator 116D and an impedance calculator 118D.

The voltage detector 104D is configured to detect a voltage waveform of the high frequency power RF2 transmitted on the power feed line 45 and is configured to output a voltage waveform analog signal indicating the corresponding voltage waveform. This voltage waveform analog signal is input to the filter 106D. The filter 106D is configured to generate a voltage waveform digital signal by digitizing the voltage waveform analog signal input thereto. Further, the filter 106D receives, from the power supply controller 38$e$, the signal specifying the frequency of the high frequency power RF2 for each of the first sub-period Ps1($j$) and the second sub-period Ps2($j$), and then, generates a filtered voltage waveform signal by extracting, from the voltage waveform digital signal, only a component corresponding to the frequency specified by this signal. Further, the filter 106D may be composed of, by way of non-limiting example, a FPGA (Field Programmable Gate Array).

The filtered voltage waveform signal generated by the filter 106D is output to the average value calculator 110D. The average value calculator 110D receives, from the power supply controller 38e, a sub-period specifying signal specifying the first sub-period Ps1(j) and the second sub-period Ps2(j). The average value calculator 110D calculates, from the filtered voltage waveform signal, an average value VA21 of the voltages in the first sub-period Ps1(j) within the processing time of the stage S(i, j) specified by using the sub-period specifying signal. Further, the average value calculator 110D also calculates, from the filtered voltage waveform signal, an average value VA22 of the voltages in the second sub-period Ps2(j) within the processing time of the stage S(i, j) specified by using the sub-period specifying signal. Furthermore, the average value calculator 110D may be composed of, by way of non-limiting example, a FPGA (Field Programmable Gate Array).

The average value VA21 and the average value VA22 obtained by the average value calculator 110D are output to the moving average value calculator 114D. The moving average value calculator 114D calculates a moving average value (moving average value VMA21) of a preset number of average values VA21 which are obtained in the first sub-periods Ps1(j) of the present number of recently performed stages S(j) among a multiple number of average values VA21 previously obtained for the stages S(j) specified by the same value of "j" as in the stage S(i, j) among the plural stages belonging to the completed cycles CY. Further, the moving average value calculator 114D also calculates a moving average value (moving average value VMA22) of the preset number of average values VA22 which are obtained for the second sub-periods Ps2(j) of the present number of recently performed stages S(j) among the multiple number of average values VA22 previously obtained for the stages S(j) specified by the same value of "j" as in the stage S(i, j) among the plural stages belonging to the completed cycles CY. The moving average values VMA21 and VMA22 obtained by the moving average value calculator 114D are output to the impedance sensor 118D. Further, the moving average value calculator 114D may be implemented by, by way of non-limiting example, a CPU or a FPGA (Field Programmable Gate Array).

The current detector 102D is configured to detect a current waveform of the high frequency power RF2 transmitted on the power feed line 45, and is configured to output a current waveform analog signal indicating the corresponding current waveform. This current waveform analog signal is input to the filter 108D. Further, the filter 108D generates a current waveform digital signal by digitizing the current waveform analog signal input thereto. Further, the filter 108D receives, from the power supply controller 38e, the signal specifying the frequency of the high frequency power RF2 for each of the first sub-period Ps1(j) and the second sub-period Ps2(j), and then, generates a filtered current waveform signal by extracting, from the current waveform digital signal, only a component corresponding to the frequency specified by this signal. Further, the filter 108D may be composed of, by way of non-limiting example, a FPGA (Field Programmable Gate Array).

The filtered current waveform signal generated by the filter 108D is output to the average value calculator 112D. The average value calculator 112D receives the aforementioned sub-period specifying signal from the power supply controller 38e. The average value calculator 112D calculates, from the filtered current waveform signal, an average value IA21 of the electric currents in the first sub-period Ps1(j) within the processing time of the stage S(i, j) specified by using the sub-period specifying signal. Further, the average value calculator 112D also calculates, from the filtered current waveform signal, an average value IA22 of the electric currents in the second sub-period Ps2(j) within the processing time of the stage S(i, j) specified by using the sub-period specifying signal. Furthermore, the average value calculator 112D may be composed of, by way of non-limiting example, a FPGA (Field Programmable Gate Array).

The average value IA21 and the average value IA22 obtained by the average value calculator 112D are output to the moving average value calculator 116D. The moving average value calculator 116D calculates a moving average value (moving average value IMA21) of the preset number of average values IA21 which are obtained in the first sub-periods Ps1(j) of the present number of recently performed stages S(j) among the multiple number of average values IA21 previously obtained for the stages S(j) specified by the same value of "j" as in the stage S(i, j) among the plural stages belonging to the completed cycles. Further, the moving average value calculator 116D also calculates a moving average value (moving average value IMA22) of the preset number of average values IA22 which are obtained in the second sub-periods Ps2(j) of the present number of recently performed stages S(j) among the multiple number of average values IA22 previously obtained for the stages S(j) specified by the same value of "j" as in the stage S(i, j) among the plural stages belonging to the completed cycles CY. The moving average values IMA21 and IMA22 obtained by the moving average value calculator 116D are output to the impedance sensor 118D. Further, the moving average value calculator 116D may be composed of, by way of non-limiting example, a CPU or a FPGA (Field Programmable Gate Array).

The impedance calculator 118D calculates the moving average value Imp21 of the load impedance of the high frequency power supply 38A from the moving average value IMA21 and the moving average value VMA21. This moving average value Imp21 includes an absolute value and a phase component. Further, the impedance calculator 118D also calculates the moving average value Imp22 of the load impedance of the high frequency power supply 38A from the moving average value IMA22 and the moving average value VMA22. This moving average value Imp22 includes an absolute value and a phase component. The moving average values Imp21 and Imp22 obtained by the impedance calculator 118D are output to the power supply controller 38e. The moving average values Imp21 and Imp22 are used to set the frequency of the high frequency power RF2 in the power supply controller 38e, as stated above.

Referring back to FIG. 12, the matching device 42A includes, like the matching device 42, a matching circuit 42a, a sensor 42b, a controller 42c and actuators 42d and 42e. Below, regarding the individual components of the matching device 42A, distinctive features from the corresponding components of the matching device 42 will be discussed.

Like the impedance sensor 38d, the sensor 42b of the matching device 42A receives, from the power supply controller 38e, the signal specifying the frequency of the high frequency power RF2 for each of the first sub-period Ps1(j) and the second sub-period Ps2(j), and then, generates a filtered voltage waveform signal by extracting, from the voltage waveform digital signal, only the component corresponding to the frequency specified by this signal. Further, the sensor 42b outputs the filtered voltage waveform signal to the controller 42c. Furthermore, like the impedance sensor 38d, the sensor 42b of the matching device 42A receives, from the power supply controller 38e, the signal specifying the frequency of the high frequency power RF2 for each of the first sub-period Ps1(j) and the second sub-period Ps2(j), and then, generates a filtered current waveform signal by extracting, from the current waveform digital signal, only the component corresponding to the frequency specified by this signal. The sensor 42b outputs this filtered current waveform signal to the controller 42c.

If the moving average value Imp21 or the moving average value Imp22 does not fall within the preset control range, in response to the aforementioned control signal which is sent from the power supply controller 38e, the controller 42c of the matching device 42A controls the actuators 42d and 42e such that the load impedance of the high frequency power supply 38A specified by an average value of the moving average value Imp21 and the moving average value Imp22 approximates to the matching point. Alternatively, if the moving average value Imp21 or the moving average value Imp22 does not fall within the preset control range, in response to the aforementioned control signal which is sent from the power supply controller 38e, the controller 42c of the matching device 42A controls the actuators 42d and 42e such that the load impedance of the high frequency power supply 38A specified by the moving average value Imp22 approximates to the matching point.

Figure 14:
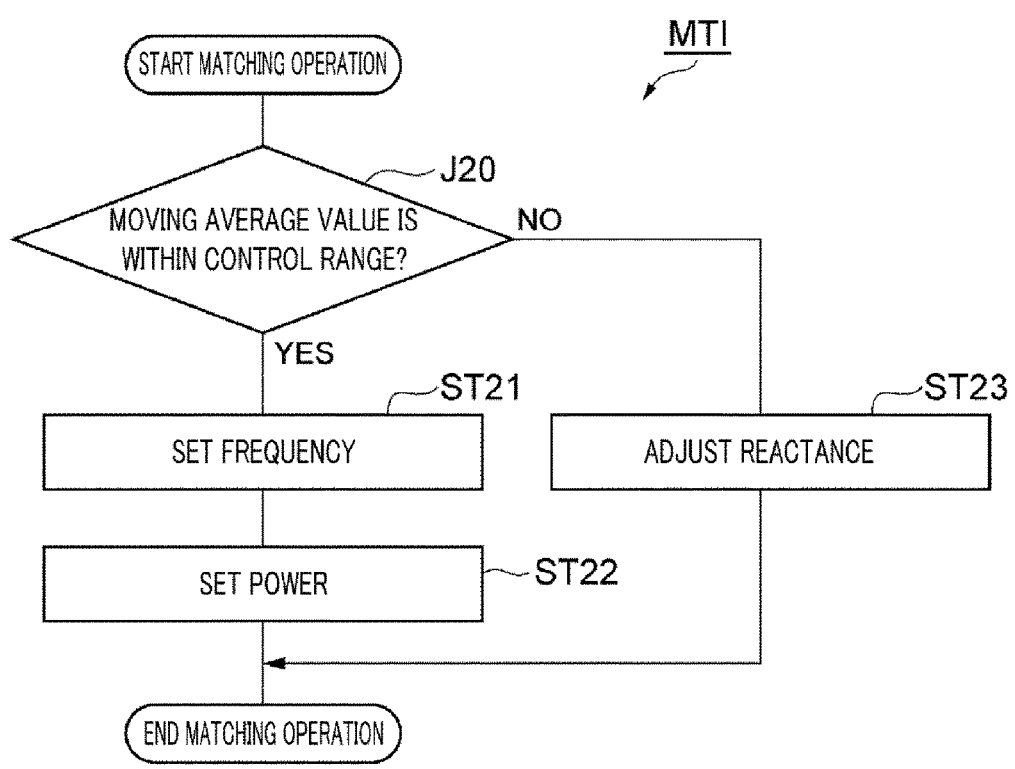
FIG. 14 is a flowchart for describing a method of an impedance matching performed in a plasma processing method according to another exemplary embodiment.

Now, a method of an impedance matching performed by the plasma processing apparatus 1 which is equipped with the high frequency power supply 36A, the matching device 40A, the high frequency power supply 38A and the matching device 42A as described above with reference to FIG. 10 to FIG. 13 will be explained. FIG. 14 is a flowchart for describing the method of the impedance matching performed in a plasma processing method according to another exemplary embodiment.

The method MTI of the impedance matching shown in FIG. 14 is performed in each of the plural stages S. When initially performing the method MT, each of the plural stages S is not performed a sufficient number of times to calculate the aforementioned moving average values Imp11, Imp12, Imp21 and Imp22. Thus, when initially performing the method MT, only the calculation of the aforementioned average values VA11, IA11, VA12, IA12, VA21, IA21, VA22 and IA22 and the accumulation thereof are performed.

After each of the plural stages S is performed a sufficient number of times to calculate the moving average values Imp11, Imp12, Imp21 and Imp22, the impedance sensor 36d calculates the moving average value Imp11 and the moving average value Imp12, and the impedance sensor 38d calculates the moving average values Imp21 and Imp22.

As shown in FIG. 14, a process J20 is performed in the method MTI. In the stage S(i, j) in which the high frequency power RF1 is supplied to the susceptor 16, it is determined, in the process J20, by the power supply controller 36e whether the moving average value Imp11 and the moving average value Imp12 are within the aforementioned preset control range.

If it is determined that the moving average value Imp11 and the moving average value Imp12 are within the aforementioned preset control range, the power supply controller 36e sets, in a process ST21, the frequency of the high frequency power RF1 in the first sub-period Ps1(j) and the frequency of the high frequency power RF1 in the second sub-period Ps2(j), as stated above. Then, in a subsequent process ST22, the power supply controller 36e sets the power level of the high frequency power RF1 in the first sub-period Ps1(j), and sets the power level of the high frequency power RF1 in the second sub-period Ps2(j), as stated above.

Meanwhile, if it is determined that the moving average value Imp11 or the moving average value Imp12 does not fall within the aforementioned preset control range, a control signal is sent from the power supply controller 36e to the matching device 40A in a process ST23 to allow the matching device 40A to perform the impedance matching of the high frequency power supply 36A. In response to this control signal, the controller 40c of the matching device 40A controls the actuators 40d and 40e such that the load impedance of the high frequency power supply 36A approximates to the matching point, as stated above.

Further, in the stage S(i, j) where the high frequency power RF2 is supplied to the susceptor 16, it is determined, in the process J20, by the power supply controller 38e whether the moving average value Imp21 and the moving average value Imp22 are within the aforementioned preset control range.

If it is determined that the moving average value Imp21 and the moving average value Imp22 are within the aforementioned preset control range, the power supply controller 38e sets, in the process ST21, the frequency of the high frequency power RF2 in the first sub-period Ps1(j) and the frequency of the high frequency power RF2 in the second sub-period Ps2(j), as stated above. Then, in the subsequent process ST22, the power supply controller 38e sets the power level of the high frequency power RF2 in the first sub-period Ps1(j), and sets the power level of the high frequency power RF2 in the second sub-period Ps2(j), as stated above.

Meanwhile, if it is determined that the moving average value Imp21 or the moving average value Imp22 does not fall within the aforementioned preset control range, a control signal is sent from the power supply controller 38e to the matching device 42A in the process ST23 to allow the matching device 42A to perform the impedance matching of the high frequency power supply 38A. In response to this control signal, the controller 42c of the matching device 42A controls the actuators 42d and 42e such that the load impedance of the high frequency power supply 38A approximates to the matching point, as stated above.

Since the first sub-period Ps1(j) within the processing time of the stage S(i, j) in which the high frequency power RF1 is supplied to the susceptor 16, e.g., the first sub-period Ps1(j) within the processing time of the stage S(i, 3), is a period including a time point when the setting of the high frequency power RF1 is changed, the reflection wave on the power feed line 43 may be larger than the reflection wave in the second sub-period Ps2(j). Thus, in order to reduce the reflection wave of the high frequency power RF1, it is required to match the load impedance of the high frequency power supply 36A in each of the first sub-period Ps1(j) and the second sub-period Ps2(j) with the output impedance of the high frequency power supply 36A individually. According to the method MTI, the frequency of the high frequency power RF1 in the first sub-period Ps1(j) is adjusted such that the load impedance of the high frequency power supply 36A estimated from the moving average value Imp11 approximates to the output impedance of the high frequency power supply 36A. Further, the frequency of the high frequency power RF1 in the second sub-period Ps2(j) is adjusted based on the moving average value Imp12 in the same way as stated above. According to the method MTI, since the high frequency power supply 36A can change the frequency of the high frequency power RF1 at a high speed, it is possible to perform the impedance matching while keeping up with the variation of the load impedance at a high speed. Furthermore, through the process ST22, in case that the power of the high frequency power RF1 combined to the plasma is insufficient in the first sub-period Ps1(j), the power of the high frequency power RF1 can be supplemented.

Further, since the first sub-period Ps1(j) within the processing time of the stage S(i, j) in which the high frequency power RF2 is supplied to the susceptor 16, e.g., the first sub-period Ps1(j) within the processing time of the stage (i, 2), is a period including a time point when the setting of the high frequency power RF2 is changed, the reflection wave on the power feed line 45 may be larger than the reflection wave in the second sub-period Ps2(j). Thus, in order to reduce the reflection wave of the high frequency power RF2, it is required to match the load impedance of the high frequency power supply 38A in each of the first sub-period Ps1(j) and the second sub-period Ps2(j) with the output impedance of the high frequency power supply 38A individually. According to the method MTI, the frequency of the high frequency power RF2 in the first sub-period Ps1(j) is adjusted such that the load impedance of the high frequency power supply 38A estimated from the moving average value Imp21 approximates to the output impedance of the high frequency power supply 38A. Further, the frequency of the high frequency power RF2 in the second sub-period Ps2(j) is adjusted based on the moving average value Imp22 in the same way as stated above. According to the method MTI, since the high frequency power supply 38A can change the frequency of the high frequency power RF2 at a high speed, it is possible to perform the impedance matching while keeping up with the variation of the load impedance at a high speed. Furthermore, through the process ST22, in case that the power of the high frequency power RF2 combined to the plasma is insufficient in the first sub-period Ps1(j), the power of the high frequency power RF2 can be supplemented.

In the above, the various exemplary embodiments have been described. However, the exemplary embodiments are not limiting, and various changes and modifications may be made. By way of example, the high frequency power supply 36 and the high frequency power supply 36A may be configured to supply the high frequency power RF1 to the upper electrode 46. Further, the plasma processing apparatus configured to perform the method MT is not limited to the capacitively coupled plasma processing apparatus. The method MT may also be applicable to any of various plasma processing apparatuses equipped with the first electrode and the second electrode, e.g., an inductively coupled plasma processing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

I claim:
1. A plasma processing method performed by a plasma processing apparatus, wherein the plasma processing apparatus comprises:
   a processing vessel;
   a gas supply system configured to supply a gas into the processing vessel;
   a first electrode and a second electrode arranged with a space within the processing vessel therebetween;
   a first high frequency power supply configured to output a first high frequency power;
   a second high frequency power supply configured to output a second high frequency power having a frequency lower than that of the first high frequency power;
   a first power feed line configured to connect the first high frequency power supply to either one electrode of the first electrode and the second electrode;
   a second power feed line configured to connect the second high frequency power supply to the second electrode;
   a first matching device configured to adjust a load impedance of the first high frequency power supply;
   a second matching device configured to adjust a load impedance of the second high frequency power supply;
   a first operation unit configured to calculate a first parameter including any one of the load impedance, a load resistance, a load reactance of the first high frequency power supply, and a reflection wave coefficient of the first high frequency power; and
   a second operation unit configured to calculate a second parameter including any one of the load impedance, a load resistance, a load reactance of the second high frequency power supply, and a reflection wave coefficient of the second high frequency power,
   wherein multiple cycles, each having plural stages which generate plasma of different processing gases within the processing vessel and which are performed in sequence, are performed sequentially in the plasma processing method, and
   wherein the plasma processing method comprises:
   changing the processing gas output from the gas supply system when transitioning from a first preceding stage to a first succeeding stage among the plural stages, the first high frequency power being supplied to the either one electrode in the first preceding stage;
   increasing a power level of the second high frequency power at a first time point when the first parameter exceeds a first threshold value after the processing gas output from the gas supply system is changed when transitioning from the first preceding stage to the first succeeding stage, the first high frequency power being continuously supplied to the either one electrode at least up to the first time point from the first preceding stage;
   changing the processing gas output from the gas supply system when transitioning from a second preceding stage to a second succeeding stage among the plural stages, the second high frequency power being supplied to the second electrode in the second preceding stage; and
   increasing a power level of the first high frequency power at a second time point when the second parameter exceeds a second threshold value after the processing gas output from the gas supply system is changed when transitioning from the second preceding stage to the second succeeding stage, the second high frequency power being continuously supplied to the second electrode at least up to the second time point from the second preceding stage.

2. The plasma processing method of claim 1, further comprising:
   calculating, by a time adjusting unit of the plasma processing apparatus, a first time difference from when transitioning to the first succeeding stage to the first time point;

adjusting a length of a preset processing time of the same stage as the first succeeding stage in a cycle performed after a preceding cycle among the multiple cycles to be increased by the first time difference obtained in the preceding cycle among the multiple cycles;

calculating, by the time adjusting unit, a second time difference from when transitioning to the second succeeding stage to the second time point; and adjusting a length of a preset processing time of the same stage as the second succeeding stage in a cycle performed after a preceding cycle among the multiple cycles to be increased by the second time difference obtained in the preceding cycle among the multiple cycles.

3. The plasma processing method of claim 1, wherein the first preceding stage is a first stage of generating plasma of a first processing gas while the first high frequency power is being supplied to the either one electrode, the first succeeding stage and the second preceding stage are a second stage which follows the first stage and generates plasma of a second processing gas while the second high frequency power is being supplied to the second electrode, and the second succeeding stage is a third stage which follows the second stage and generates plasma of a third processing gas while the first high frequency power is being supplied to the either one electrode.

4. The plasma processing method of claim 3, wherein the first processing gas contains a rare gas and a fluorocarbon gas, the second processing gas contains a rare gas, and the third processing gas contains a rare gas and an oxygen gas.

5. The plasma processing method of claim 3, wherein the plasma of the first processing gas is generated in the first stage while the second high frequency power is not supplied to the second electrode, the plasma of the second processing gas is generated in the second stage while the first high frequency power is not supplied to the either one electrode, and the plasma of the third processing gas is generated in the third stage while the second high frequency power is not supplied to the second electrode.

6. The plasma processing method of claim 1, wherein the plasma processing apparatus further comprises a DC power supply connected to the first electrode and configured to generate a negative DC voltage, and the plasma processing method further comprises changing a level of the DC voltage at the first time point and/or the second time point.

* * * * *